(12) United States Patent
Sogard et al.

(10) Patent No.: US 7,250,618 B2
(45) Date of Patent: Jul. 31, 2007

(54) RADIANTLY HEATED CATHODE FOR AN ELECTRON GUN AND HEATING ASSEMBLY

(75) Inventors: Michael Sogard, Menlo Park, CA (US); Mark Takita, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/050,394

(22) Filed: Feb. 2, 2005

(65) Prior Publication Data

US 2006/0169928 A1    Aug. 3, 2006

(51) Int. Cl.
    G21K 5/10    (2006.01)
    G01N 23/04    (2006.01)
(52) U.S. Cl. .................. 250/492.24; 250/311; 250/307
(58) Field of Classification Search ................ 250/311, 250/307, 310, 492.2
    See application file for complete search history.

(56) References Cited

U.S. PATENT DOCUMENTS

| | | | |
|---|---|---|---|
| 3,296,923 A | 1/1967 | Miles | |
| 4,492,873 A * | 1/1985 | Dmitriev et al. | 250/492.3 |
| 4,497,015 A | 1/1985 | Konno et al. | |
| 4,590,598 A | 5/1986 | O'Harra, II | |
| 4,619,508 A | 10/1986 | Shibuya et al. | |
| 4,688,884 A | 8/1987 | Scifres et al. | |
| 4,744,615 A | 5/1988 | Fan et al. | |
| 4,932,747 A | 6/1990 | Russell et al. | |
| 5,227,700 A | 7/1993 | Nagai et al. | |
| 5,291,505 A | 3/1994 | Nielsen | |
| 5,303,248 A | 4/1994 | Gibbs | |
| 5,376,770 A | 12/1994 | Kuhl et al. | |
| 5,541,951 A | 7/1996 | Juhasz et al. | |
| 6,014,200 A | 1/2000 | Sogard et al. | |

(Continued)

FOREIGN PATENT DOCUMENTS

EP    1150402 A2    10/2001

(Continued)

OTHER PUBLICATIONS

L.A. MacKenzie, An Investigation of Electon Emission From A Tungsten Surface Induced By A Laser Beam, Technical Documentary Report No. RADC-TDR-63-465, 1965, vol. II, Dec. 31, Department of Defense, Cameron Station, Alexandria, Virginia, USA.

(Continued)

*Primary Examiner*—Nikita Wells
*Assistant Examiner*—Johnnie L Smith, II
(74) *Attorney, Agent, or Firm*—Steven G. Roeder; James P. Broder

(57) ABSTRACT

A heating assembly (36) for heating a cathode (38) of an electron gun (30) of an exposure apparatus (10) includes a radiation source (42) and a beam shaper (44). The radiation source (42) generates a source beam (46). The beam shaper (44) receives the source beam (46) and selectively shapes the source beam (46) into a shaped beam (48) that is directed to the cathode (38). In certain embodiments, the beam shaper (44) can readily change the shape and intensity profile of the shaped beam (48) to achieve a desired electron beam (32) from the electron gun (30). In one embodiment, the radiation source (42) generates a pulsed source beam (46).

71 Claims, 14 Drawing Sheets

U.S. PATENT DOCUMENTS

| | | | |
|---|---|---|---|
| 6,028,870 | A | 2/2000 | Deutsch et al. |
| 6,091,187 | A * | 7/2000 | Golladay et al. ............ 313/310 |
| 6,218,676 | B1 * | 4/2001 | Nakasuji ................... 250/492.3 |
| 2003/0132382 | A1 * | 7/2003 | Sogard ....................... 250/311 |

FOREIGN PATENT DOCUMENTS

| | | |
|---|---|---|
| JP | 5159694 | 12/1991 |
| JP | 6181029 | 12/1992 |

OTHER PUBLICATIONS

R.M. Gilgenbach et al., Laser Heated LaB$_6$ Thermionic Cathode on a MV Electron Beam Accelerator, IEEE International Conference on Plasma Science, 1999, Pp. 270, Monterey, California, USA.

M.E. Read et al., High Current Density Cathodes For Microwave Tubes, Proceedings of the SPIE—The International Society for Optical Engineering, 1988, vol. 1039, pp. 420-421, Thirteenth International Conference on Infrared and Millimeter Waves, Honolulu, Hawaii, USA.

Ryo Ilyoshi et al., Local Heating of Point Cathode: Numerical Calculations of Temperature Distribution and Cathode Shape Variation by Evaporation, J Electron Microscience, 1990, vol. 39, No. 4, pp. 215-222, Japan.

G. Mollenstedt et al., Use of a Focussed Laser Beam For Heating The Cathode of an Electron Gun, Optik, 1978, vol. 51, No. 4, pp. 417-421, West Germany.

P.K. Roy, Study of a Laser-Heated Electron Gun, Rev. Science Instrum., Dec. 1996, vol. 67, No. 12, pp. 4098-4102, American Institute of Physics, USA.

T. Sameshima and S. Usui, Optic Communications, 88, 59 (1992).

Larry Hornbeck, From cathode rays to digital micromirrors: a history of electronic projection display technology. TI Technical Journal, Jul.-Sep. 1998, pp. 7-46.

Donald O'Shea, Elements of Modern Optical Design. Jon Wiley & Sons, 1985.

M. Wagner et al. Meas. Sci. Technol. 1, 1193 (1990).

Investigation of New Concepts for Microwave Power Generation (Laser Studies). Technical Documentary Report No. RADC-TDR-63-465, vol. 2; AD 427115. Dec. 1963.

K. Ohkubo et al. Enhanced quantum efficiency of metal/metal compound photocathode irradiated by two wavelengths of Nd: YAG laser. Nuclear Instruments & Methods in Physics Research, Section A. vol. 393, No. 1-3, Jul. 1, 1997, pp. 460-463.

Gerry Gooding. Electron Beam Lithography. IJET 12@Monterey.

Laser Diode Array Inc. High Power Laser Diode Arrays. http//www.1dai.com/images/WebReadyDonutdata/100WCWDonut.htm.

N. Davidson et al. Concentration and collimation of diffuse linear light sources. American Institute of Physics. Appl. Phys. Lett. 62 (4). Jan. 25, 1993.

Liquid Crystal Waveplates: Liquid Crystal Spatial Light Modulator. Meadowlar optics. http://www.meadowlark.com/catalog/SLMs/appnote.htm.

L.A. MacKenzie, An Investigation of Electron Emission From a Tungsten Surface Induced by a Laser Beam.

Search Report and Written Opinion for PCT/US2006/03175 (related to the present application).

* cited by examiner

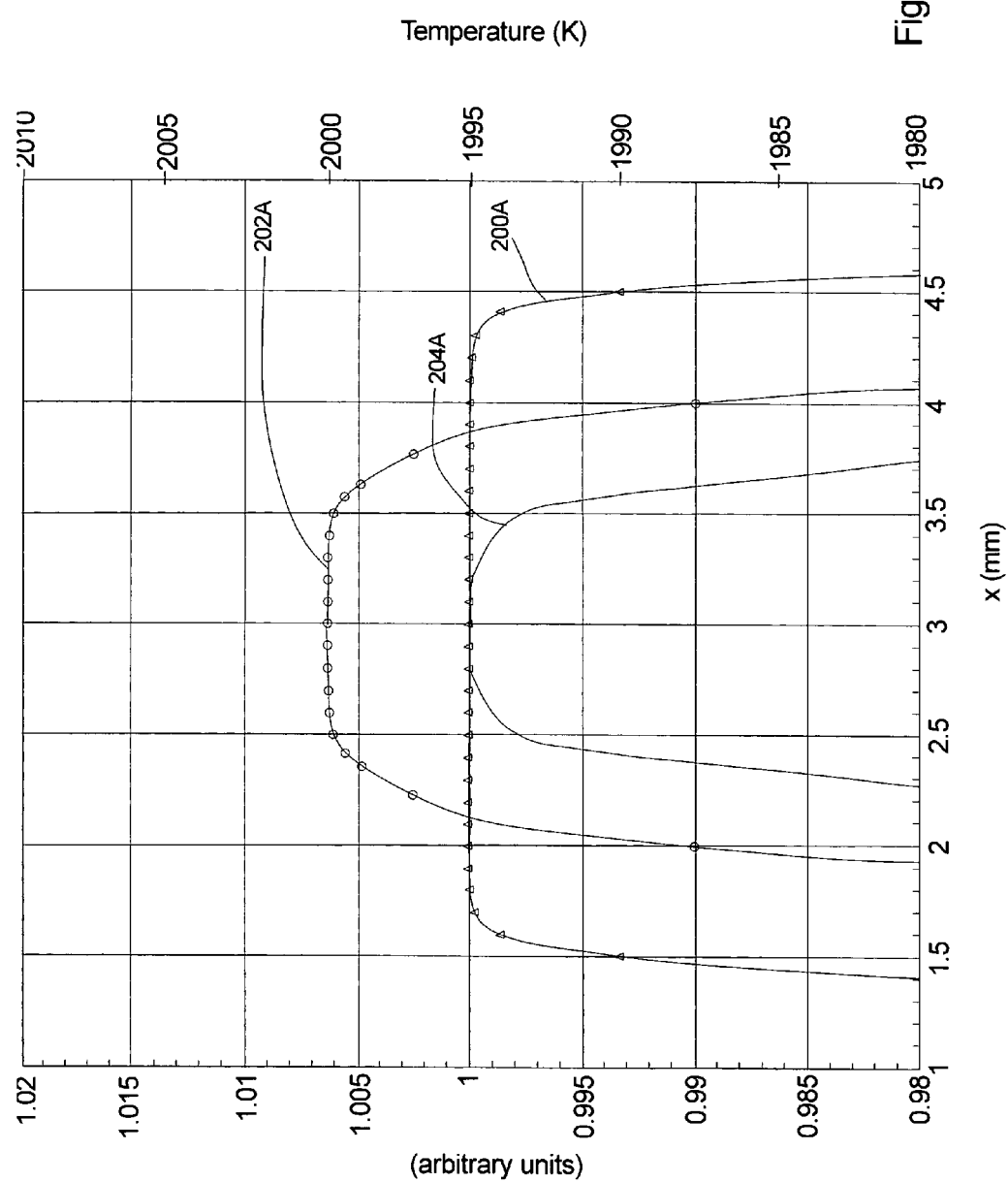

RADIANTLY HEATED CATHODE FOR AN ELECTRON GUN AND HEATING ASSEMBLY

FIELD OF THE INVENTION

The present invention relates generally to electron guns. More specifically, the present invention relates a heating assembly and method for heating a cathode of an electron gun so that the electron gun produces a desired electron beam.

BACKGROUND

Electron beam lithography systems have been used for semiconductor processing for many years. Their application has been somewhat limited however. While electron beam systems can have unsurpassed resolution, their speed of exposing patterns on wafers has historically been inferior to that of other lithography tools, such as optical lithography steppers and scanners. This results in low throughput of exposed product.

Recently, electron beam projection lithography exposure systems have been developed which are expected to offer greatly enhanced throughput. These systems direct a relatively large area electron beam onto a portion ("subfield") of a reticle containing the pattern associated with a specific process step for a semiconductor device. The electron beam transmitted through the reticle is projected onto a wafer where it forms a demagnified image of the illuminated part of the reticle. The reticle and wafer are mounted on precision high speed stages. By a combination of stage movement and electromagnetic deflection of the electron beam, the entire pattern of the reticle is sequentially transferred to the wafer where it exposes an electron sensitive resist. After exposure, the resist on the wafer is developed, and regions of the resist exposed by the electrons are removed, for a positive type resist; or regions of the resist not exposed by the electrons are removed, for a negative type resist. The remaining resist forms a stencil mask, with which the mask features can be transferred into the wafer by etching or deposition processes.

Throughput is enhanced with these electron beam projection lithography exposure systems because all features of the illuminated part of the reticle are transferred to the wafer simultaneously. Past electron beam lithography systems typically transferred the device pattern to the wafer sequentially, with each exposure step transferring at most a few simple geometrical shapes. Throughput in electron beam lithography systems can also be limited by Coulomb interactions between the electrons in the beam. The electric charge carried by the electrons results in repulsive forces which can defocus and blur the image at the wafer. This puts an upper limit on the maximum beam current the electron beam lithography system can effectively operate at, and this in turn limits the useful throughput of the lithography system. However, several features of electron beam projection lithography systems serve to mitigate this situation, allowing higher beam currents, and correspondingly higher throughputs. For example, by increasing the size of the beam illuminating the reticle, for a given beam current, the current density in the beam is reduced. This reduces the effect of the Coulomb interactions. Also, increasing the numerical aperture, i.e. increasing the electron beam half angle, will also reduce Coulomb interaction effects. However, there is an upper limit to the magnitude of the numerical aperture, because geometrical aberrations, which can blur the image at the wafer, increase rapidly with the numerical aperture.

Currently, an additional requirement of electron beam projection lithography systems is that the intensity of the electron beam be uniform, so that all features are exposed in the resist under the same conditions. If the beam is non-uniform, the dimensions of the features in the developed resist may not be faithfully rendered, and some small features may not even be reproduced. To avoid this situation electron beam uniformities of about 1% or better are required at the reticle.

Furthermore, the total electron charge density (the "dose") delivered to an illuminated region of the wafer must be controlled rigorously, so that the electron sensitive resist is properly exposed. If the dose is not carefully controlled, the dimensions of the features in the developed resist may not be faithfully rendered, and some small features may not even be reproduced. The dose is normally controlled by carefully timing the exposure of the illuminated region of the wafer. Therefore, the electron beam current from the gun must be constant in time.

The desired large subfield and numerical aperture of electron beam projection lithography systems mean that the electron beam emittance is much greater than in conventional electron beam lithography systems, where emittance is defined as the product of beam size and angular half-width of the angular distribution of the electrons. In the absence of apertures, which can remove part of the beam, or electron optical subsystems which change the beam energy, emittance is a fundamental property of the electron optical system. Thus, electron beam projection lithography systems can require an electron source, or gun, which also possesses high emittance.

One way of obtaining high-emittance from the electron gun is to use a large heated cathode that emits electrons over a relatively large area. For example, if the subfield at the wafer in an electron beam projection lithography system is 0.25 mm, and the numerical aperture is 8 mrad, the emittance as defined above is 2 mm-mrad. This is several orders of magnitude larger than the emittance of conventional electron beam lithography systems. At the cathode of the electron gun, the half angle of the electrons accelerated out of the gun is given approximately by the ratio of the electron's transverse momentum to its axial momentum. The transverse momentum is related to the thermal energy the electron acquires from the heated cathode, while the axial momentum is related to the beam energy imparted to the electron by the gun. If the accelerating voltage of the gun is V and the cathode temperature is T, then the electron beam half angle is equal to approximately $(kT/eV)^{1/2}$, where k is Boltzmann's constant and e is the electron charge. For an accelerating voltage of 100 kV and a cathode temperature of 2000° K, the beam half angle is roughly 1 mrad. Thus, the emittance requirement calls for a minimum cathode size of approximately 2 mm. However, in order to meet the uniformity requirement, a very uniform electric field to extract the electrons is needed at the cathode, so to avoid perturbing edge field effects the cathode may need to be several times larger in reality. Also a planar cathode is desirable.

Electron emission from the cathode can be limited by the cathode temperature ("temperature limited operation") or by the accumulation of an electron cloud in front of the cathode, which partially shields the cathode from the accelerating electric field which extracts the electrons into the beam ("space charge limited operation"). Since the electron cloud distorts the electric field, uniform extraction of beam over the emitting part of the cathode will be difficult. Thus, temperature limited operation may be preferred. This puts some constraints on the cathode properties.

The current density j of electrons emitted from a heated cathode is given to a good approximation by the Richardson-Dushman equation, $$j = AT^2 exp[-e\phi/kT],\quad\quad\quad (Eq.\ 1)$$

where A is a constant, and φ is the work function of the material. The work function typically varies with the material's crystalline properties, such as the crystalline orientation at the cathode surface. Thus, the beam uniformity basically requires that the cathode be a single crystal, so that φ is constant. In addition, the temperature of the cathode must be very uniform. For example, for a cathode work function of φ=4 V, a beam uniformity of approximately 1% requires the cathode temperature to be controlled to within approximately 1° K at a cathode temperature of approximately 2000° K.

One method for heating the cathode includes using a heated filament located near the cathode. The filament serves as a source of electron bombardment to heat the cathode to incandescence. Another method includes heating an intermediate cathode with a filament, which then heats the real cathode primarily by radiation.

These methods have provided some success, but they also suffer from certain disadvantages. For example, with a filament, it is difficult to control the area and uniformity of the heating of the cathode. This makes it difficult to obtain temperature uniformity of the cathode.

Additionally, any variations in the local properties of the cathode, such as a variation in the work function of the cathode, can influence electron emission. Also, variations in the thermal emissivity across the cathode surface may create variations in cathode temperature, which will affect the local electron current density. With a filament, there is no way to locally adjust the temperature at different regions of the cathode to compensate for the variation in the work function or emissivity. The heating filament also increases the size and complexity of the electron gun, and the heat generated by the filament adds substantially to the heating within the electron gun, which must be controlled typically with a fluid cooling.

Moreover, a typical filament has a finite lifetime, and must be replaced periodically. During filament replacement, the gun chamber must be opened and the internal components of the electron gun are exposed to atmospheric pressure. Further, the filament heating current and its voltage bias relative to the cathode is controlled by a power supply, which must be biased relative to ground at the cathode voltage. Because the exposure apparatus can operate at high voltages, this biasing has significant impact on the power supply design. At the same time, the power supply to the filament must be stable and noise free, to avoid perturbing the electron beam emitted from the cathode.

Additionally, precision heating of the cathode can be difficult when relatively small incremental amounts of heat need to be added to maintain and/or adjust the temperature of the cathode.

In light of the above, there is a need for a heating assembly that provides substantially uniform heating of the cathode. Further, there is a need for a heating assembly that provides precise heating of the cathode or other object. Still further, there is a need for a heating assembly that minimizes the cooling requirements within the electron gun chamber. Additionally, there is a need for a gun assembly that provides improved electron beam uniformity and stability. Still, there is a need for a gun assembly that is relatively compact, simple, and cost effective to manufacture, assemble and use.

SUMMARY

The present invention is directed to a heating assembly for an electron gun of an exposure apparatus. The electron gun includes a cathode. In one embodiment, the heating assembly includes an electromagnetic radiation-source and a beam shaper. The electromagnetic radiation source generates a source beam. The beam shaper receives the source beam and selectively adjusts the intensity profile and shape of the source beam into a shaped beam that is directed to the electron gun. More specifically, the shaped beam is directed to the cathode. The shaped beam heats the cathode to the desired temperature and temperature distribution.

In one embodiment, the beam shaper can readily change the shape and intensity profile of the source beam to achieve a desired electron beam from the electron gun. In one embodiment, the shaped beam has a characteristic that corresponds to a characteristic of the electron beam. For example, the shaped beam can have a cross-sectional shape and/or a cross-sectional area that are related to a cross-sectional shape and/or cross-sectional area, respectively, of the electron beam. As examples, the beam shaper can include an optical assembly, an aperture assembly, a filter assembly and/or a spatial light modulator.

In one embodiment, the radiation source is a laser that provides a continuous beam. The wavelength of the laser can be chosen such that the laser beam is readily absorbed by the cathode surface. Appropriate lasers include $CO_2$, NdYAG, semiconductor diode, argon ion, and excimer lasers. One version includes a plurality of laser diodes that cooperate to provide the source beam. In one version, the laser diodes are arranged linearly in a planar array. In an alternative version, multiple laser diode arrays are arranged in an annular configuration to form a donut shaped laser diode configuration.

In another embodiment, the radiation source can be an incoherent source, such as a mercury arc lamp.

In yet another embodiment, the radiation source is pulsed at a fixed power level. For example, in this embodiment, the radiation source can be a pulsed laser. When using a pulsed radiation source, the heating assembly can include a pulse controller that controls the duration of the bursts to precisely control the amount of energy transferred to the cathode. For example, short burst periods would deliver relatively low amounts of energy and long burst periods would deliver higher amounts of energy to the cathode. The radiation source can be pulsed at a fixed or variable interval. The pulse controller can control the on time during each period to control the amount of heat delivered to the cathode.

In one embodiment, the pulsed radiation source is used with a beam shaper. Alternatively, the pulsed radiation source is used without a beam shaper. Still alternatively, the pulsed radiation source can be used to precisely heat a substrate other than a cathode.

The heating assembly can also include a beam splitter. In this embodiment, the source beam passes through a beam shaper and then the beam splitter, where a portion of the source beam is transferred directly to the electron gun, and a portion of the source beam is transferred to an additional beam shaper, after which it is recombined with the source beam. Additionally, the heating assembly can also include a polarizer that polarizes the source beam and/or the shaped beam.

The present invention is also directed to a gun assembly, an exposure apparatus, a device made with the exposure apparatus, a wafer made with the exposure apparatus, a method for heating a cathode of a gun assembly, a method for making a gun assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIGS. 2A–2B graphically illustrate alternative intensity profiles for the shaped beams, cathode temperatures, and electron emission current density;

DESCRIPTION

Figure 1:
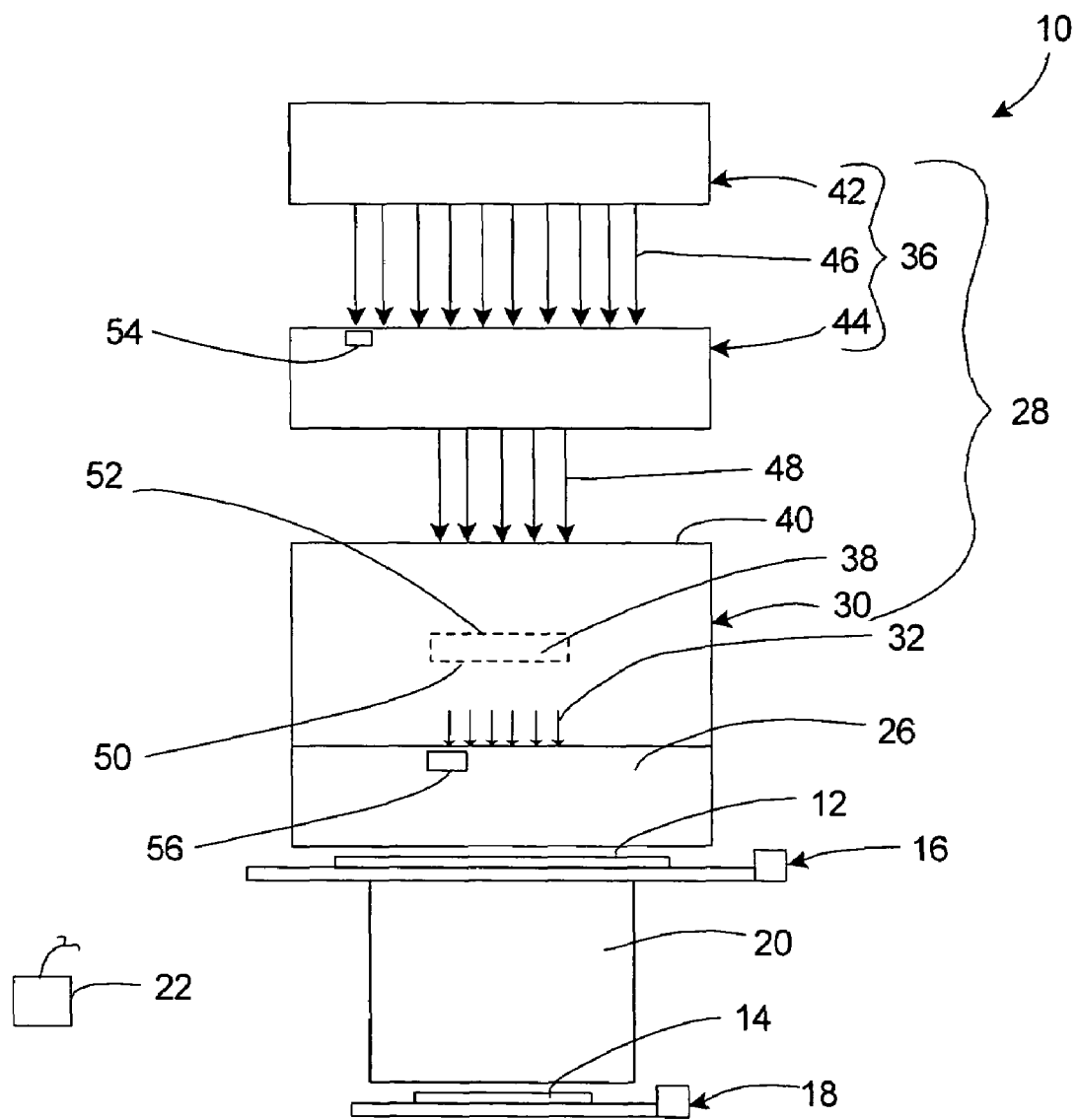
FIG. 1 is a schematic illustration of an exposure apparatus having features of the present invention.

FIG. 1 is a schematic illustration of a precision assembly, namely an exposure apparatus 10, having features of the present invention. The exposure apparatus 10 is particularly useful as an electron beam projection lithography system that transfers a pattern (not shown) of an integrated circuit from a reticle 12 onto a device, such as a semiconductor wafer 14. In FIG. 1, the exposure apparatus 10 includes a reticle stage assembly 16, a wafer stage assembly 18, a projection optical assembly 20, a control system 22, a measurement system (not shown), an illumination optical assembly 26, and a gun assembly 28.

The gun assembly 28 includes an electron gun 30 that generates an electron beam 32. The electron beam 32 is guided by the illumination optical assembly 26 to the reticle 12. The patterned area of the reticle 12 is divided into subfields, and in one embodiment, the electron beam 32 size and shape are adjusted by the illumination optical assembly 26 to match the size and shape of the subfields. The electron beam 32 emerging from the reticle 12 is guided and focused by the projection optical assembly 20 onto the wafer 14 which is coated with an electron sensitive resist. The reticle 12 is mounted on the reticle stage assembly 16, and the wafer 14 is mounted on the wafer stage assembly 18. The electron beam 32 can be deflected to different subfields on the reticle 12 by electromagnetic deflectors (not shown) in the illumination optical assembly 26. Electromagnetic deflectors in the projection optical assembly 20 can similarly deflect the electron beam 32 to appropriate locations on the wafer 14.

In operation, in one embodiment, the electron beam 32 is deflected sequentially to the subfields on the reticle 12 while simultaneously the electron beam 32 in the projection optical assembly 20 is deflected to corresponding locations on the wafer 14, so that the complete pattern on the reticle 12 is sequentially projected onto the wafer 14. At the same time, the reticle stage assembly 16 is moved perpendicular to an optical axis of the illumination optical assembly 26, and the wafer stage assembly 18 is moved perpendicular to an optical axis of the projection optical assembly 20, to limit the maximum amount of electron beam 32 deflection required. The electron beam 32 is turned on and off ("blanked") appropriately to control the exposure of the resist. The reticle stage assembly 16 and the wafer stage assembly 18 positions are continuously monitored by the measurement system, and the control system 22 utilizes the measurement system data to coordinate and synchronize these operations. The electron gun 30 forms part of a hermetic enclosure which maintains the electron beam 32 in a vacuum environment.

The projection optical assembly 20 projects and/or focuses the electron beam 32 passing through the reticle 12 to the wafer 14. The projection optical assembly 20 can also deflect the electron beam 32 from a given subfield location on the reticle 12 to its corresponding location on the wafer 14. Depending upon the design of the exposure apparatus 10, the projection optical assembly 20 can magnify or reduce the image projected from the reticle 12.

In an alternate embodiment (not shown), the structure of the exposure apparatus 10 can be such that a pattern can be directly formed on the wafer 14 without the use of a reticle 12. For example, an electron beam shaper can be used to shape the electron beam 32. The electron beam shaper can include one or more multi-aperture arrays and one or more lens groups. A more complete discussion of a suitable electron beam shaper is included in U.S. Pat. No. 6,014,200, issued to Sogard on Jan. 11, 2000. As far as permitted, the contents of U.S. Pat. No. 6,014,200 are incorporated herein by reference.

The gun assembly 28 includes the electron gun 30 that serves as an illumination source for the exposure apparatus 10, and a heating assembly 36. The electron gun 30 includes a cathode 38 (illustrated in phantom), an anode (not shown in FIG. 1), and possibly additional electrodes used to adjust the properties of the electron beam 32. The heating assembly 36 heats a portion of the cathode 38. Alternatively, for example, the heating assembly 36 could be used to heat an intermediate plate (not shown) positioned near the cathode 38. The electron gun 30 emits electrons when the cathode 38 is heated, accelerates the electrons in the proper general direction and forms the electrons into the electron beam 32. The gun assembly 28 further includes a gun housing 40 which maintains the components of electron gun 30 within a controlled environment, such as a vacuum.

In FIG. 1, the heating assembly 36 includes a radiation source 42 and a beam shaper 44. The radiation source 42 generates a source beam 46. For example, as discussed below, the radiation source 42 can include one or more semiconductor diode lasers that cooperate together to generate the source beam 46.

The beam shaper 44 shapes the source beam 46 into a shaped beam 48 that is directed to and heats the cathode 38 of the electron gun 30. The design of the beam shaper 44 can be varied depending on the requirements of the particular system. As used herein, the term "beam" shall mean and include the source beam 46 and/or the shaped beam 48.

It should be noted that in FIG. 1, the radiation source 42 and the beam shaper 44 are located outside the gun housing 40. By positioning the radiation source 42 and the beam shaper 44 outside the electron gun 30, the gun housing 40 can be made relatively small. Further, with the radiation source 42 located outside the gun housing 40, the heat load inside the gun housing 40 is significantly reduced, thereby reducing cooling requirements and again allowing to make the gun housing 40 smaller. However, the gun housing 40 must include a region (not shown in FIG. 1) which is transparent to the shaped beam 48, so that the shaped beam 48 can illuminate and heat the cathode 38. Additionally, by heating the cathode 38 with the radiation source 42, the radiation source 42 does not have to float electrically at the bias of the cathode 38. This simplifies the electronics, grounding, and noise issues.

Alternately, the gun assembly 28 could be designed with a portion or all of the heating assembly 36 positioned within the gun housing 40.

The temperature to which the heating assembly 36 heats the cathode 38 will depend upon the material properties of the cathode 38, the design of the other components of the electron gun 30, and the desired intensity of the electron beam 32. For example, as provided herein, the heating assembly 36 can heat and maintain an electron emitting surface 50 of the cathode 38 at a temperature of at least approximately 1000 degrees K, 1500 degrees K, 2000 degrees K, 2500 degrees K, or 3000 degrees K. However, the heating assembly 36 can be designed to heat the electron emitting surface 50 of the cathode 38 to other temperatures.

The power of the source beam 46 required to heat the cathode 38 to a desired temperature can be estimated as follows. The minimum power required should be approximately equal to the power lost by radiative emission from the hot electron emitting surface 50 and an illuminated surface 52 of the cathode 38 to the interior of the gun housing 40. This ignores thermal conduction losses through the structures which mechanically support the cathode 38. It also ignores radiative losses from regions of the illuminated surface 52 which face the source beam 46, but are not directly illuminated by it, as well as the corresponding regions on the electron emitting surface 50 of the cathode 38. Because the temperature is expected to drop rapidly away from the illuminated regions, and because radiative power from a surface at temperature T is proportional to $T^4$, this assumption should be acceptable. It is also assumed that the cathode 38 temperature within the illuminated region is approximately uniform. Then the power radiated from the cathode surfaces 50, 52 is given by the Stefan-Boltzmann law as $$P_{rad} = A\sigma(\epsilon_1 + \epsilon_2)T^4, \qquad \text{(Eq. 2)}$$

where A is the area of the illuminated part of the cathode 38, $\sigma$ is the Stefan-Boltzmann constant, $\sigma = 5.6705 \times 10^{-8}$ W m$^{-2}$ K$^{-4}$, $\epsilon_1$ is the thermal emissivity of the illuminated surface 52, and $\epsilon_2$ is the thermal emissivity of the electron emitting surface 50 of the cathode 38. The thermal emissivity $\epsilon_1$ is also approximately equal to the fraction of incident radiation which is absorbed by the illuminated surface 52, so the incident power $P_{inc}$ must satisfy the relation $P_{rad} \leq \epsilon_1 P_{inc}$, or $$P_{inc} \geq (1 + \epsilon_2/\epsilon_1)A\sigma T^4. \qquad \text{(Eq. 3)}$$

Therefore, for a given illuminated surface 52 area and temperature, the required source power is determined by the relative values of the emissivities of the two surfaces 50, 52 of the cathode 38, and it can be reduced by making $\epsilon_2$ small and $\epsilon_1$ large (by definition, $0 \leq \epsilon \leq 1$). For example, in one embodiment, the electron emitting surface 50 of the cathode 38 is highly reflective at the wavelengths corresponding to thermal radiation at the cathode 38 temperature, and the illuminated surface 52 is highly absorbing at the wavelength of the incident radiation from the radiation source 42. In practice, there is typically little wavelength dependence of the emissivity for wavelengths in the visible and infrared range.

For example, consider a cathode 38 made of tantalum, Ta; the thermal emissivity of an untreated surface is approximately 0.36. For a circular illuminated cathode 38 area of diameter 4 mm and cathode 38 temperature of 2000° K, the radiated power from Eq. 2 is $P_{rad} \approx 8.2$ W, and the minimum required incident source power is $P_{inc} \approx 22.8$ W, from Eq. 3. However, if the electron emitting surface 50 is a highly polished single crystal, as may be necessary to ensure a uniform work function, then the emissivity will be reduced significantly (for highly polished metal surfaces, typically $\epsilon_2 \approx 0.05$). Then $P_{rad} \approx 4.67$ W and $P_{inc} \approx 13.0$ W. In addition, if the emissivity 61 of the illuminated surface 52 of the cathode 38 is increased, by mechanically roughening it or applying an absorbing layer such as carbon to it, so that $\epsilon_1$ increases to 0.9, then $P_{rad} \approx 10.8$ W and $P_{inc} \approx 12.0$ W. Even though the total radiated power increases, the required incident source power decreases, because much more of it is absorbed by the cathode 38. At the same time, the amount of source beam 46 radiation reflected from the cathode 38 would also be reduced, thereby reducing heating of the gun assembly 28 and other problems associated with the radiation not absorbed by the cathode 38.

If the source beam 46 power fluctuates, the temperature of the cathode 38 will fluctuate, and from Eq. 1 the electron beam 32 current will also fluctuate to some extent. Because this may cause an error in resist exposure dose, it is important to minimize the source beam 46 power fluctuations. Mathematical modeling shows that, because of its finite heat capacity, the cathode 38 acts like a low pass filter, and periodic fluctuations of the source beam 46 power, above some minimum frequency, have essentially no effect on the cathode 38 temperature or electron beam 32 current. In fact, if the source beam 46 power fluctuation amplitude is a few percent, periodic variations in the source beam 46 power of more than a few Hertz have negligible effect on the cathode 38 temperature for cathodes of thickness approximately equal to or greater than 1 mm. Only long term drift of the source beam 46 power needs to be controlled. This can be done straightforwardly, by detecting a fraction of the source beam 46 power with a radiation detector 54 and sending the detector signal to the control system 22 which adjusts the radiation source 42 and the source beam 46 power appropriately to maintain the detector signal constant and/or at the desired level. One could also detect a portion of the electron beam 32 from the electron gun 32 with an electron detector 56 that generates a signal relating to the electron beam intensity and/or profile and send the signal to the control system 22 which adjusts the radiation source 42 and the source beam 46 power to maintain the gun electron beam current constant and/or at the desired level.

In some of the embodiments provided herein, the heating assembly 36 adjusts the shape and the intensity of the shaped beam 48 to suit the emission requirements of the gun assembly 28 and the design of the cathode 38. In one embodiment, the heating assembly 36 heats the cathode 38 to obtain a substantially uniform temperature distribution across at least a portion of the cathode 38, such as the electron emitting surface 50 of the cathode 38. This can facilitate a substantially uniform electron beam 32 from the electron gun 30. In an alternative embodiment, the heating assembly 36 heats the cathode 38 to obtain a non-uniform temperature distribution across at least a portion of the cathode 38, such as the electron emitting surface 50 of the cathode 38.

Stated another way, the heating assembly 36 can selectively generate a shaped beam 48 that heats certain regions of the cathode 38 more than other regions of the cathode 38 to obtain the desired temperature distribution of the cathode 38 and the desired electron beam 32. Alternatively, for example, the heating assembly 36 can generate a shaped beam 48 that heats substantially the entire illuminated surface 52 of the cathode 38 to the same temperature to obtain the desired electron beam 32.

The beam shaper 44 converts the radiation intensity distribution from the radiation source 42 into the desired intensity distribution of the shaped beam 48. Because of the exponential dependence of the electron beam 32 current density on the cathode 38 temperature, from Eq. 1, significant deviations from a uniform radiation intensity distribution may not be required in practice. Therefore, while this conversion could in principle be done in one step, it is usually easier to create a uniform distribution first and then alter it appropriately to achieve the final desired distribution.

The design of the beam shaper 44 will depend on the properties of the radiation source 42. For example, means for making a uniform intensity shaped beam 48 from a non-uniform source beam 46 from the radiation source have been studied extensively for two important applications of optical lithography and thermal processing of semiconductors, and many solutions exist. For example, for an incoherent radiation source 42, such as a mercury arc lamp, Miles, U.S. Pat. No. 3,296,923, teaches that radiation from the arc lamp can be collected with an elliptical mirror, collimated, and then segmented with an array of small lenslets ("fly's eye lens"), to create an array of secondary beam sources. A second fly's eye lens positioned approximately in the front focal plane of the first fly's eye lens collimates the secondary beam sources into beamlets, and a condenser lens following the second fly's eye lens overlaps the beamlets in the object plane, providing a field of uniform illumination as well as uniform angular intensity. An improved design which can provide improved uniformity is described in Konno, U.S. Pat. No. 4,497,015, which teaches how several pairs of fly's eye lenses can be arranged in series, in order to greatly increase the number of secondary beamlets which are superimposed at the object plane, thereby enhancing the uniformity. As far as permitted, the contents of U.S. Pat. Nos. 3,296,923 and 4,497,015 are incorporated herein by reference.

Another possibility for use as the radiation source 42 is a single laser. Lasers produce beams of radiation which are typically non-uniform and often are of a gaussian cross sectional-shape. Many techniques exist to create uniform beams from them. These include selecting only a small portion of the beam from its central approximately uniform region, or utilizing apodizing filters. However, such methods are wasteful of the laser energy. The gaussian beam can be split into segments, which form secondary beam sources, and the secondary beam sources recombined on top of one another to create a uniform beam. The recombination can be done in a manner similar to that described for the incoherent radiation sources. Alternatively, the laser beam can be focused into the interior of a reflecting light pipe of polygonal shape, so that it fills the entrance of the light pipe. Provided the light pipe is long enough for the laser light to be reflected from the internal surfaces of the light pipe, it will emerge from the light pipe with a far more uniform intensity. This is described, for example, in Fan et al., U.S. Pat. No. 4,744,615, the contents of which are incorporated herein by reference. Further, improvement can be obtained by introducing a diffuser plate at the entrance of the light pipe, as described in M. Wagner et al, Meas. Sci. Technol. 1, 1193(1990), the contents of which are incorporated herein by reference. Additional improvement may be obtained, if the beam is rapidly deflected periodically ("dithered") in front of an aperture which is approximately conjugate to the illuminated surface 52 of the cathode 38, so that any remaining non-uniformities are averaged out by the dithering. If the dithering period is much shorter than the thermal relaxation time of the cathode 38, no time dependent fluctuations of any significance of the electron emitting surface 50 temperature will occur.

Alternatively, the radiation source 42 can pass through a holographic diffuser plate which can substantially alter the angular distribution. Commercially available holographic diffuser plates can convert a round collimated gaussian shaped beam into a square or rectangular beam of approximately homogeneous intensity. Suitable holographic diffuser plates can be obtained from Physical Optics Corporation, located in Los Angeles, Calif.

An additional complication associated with laser beams is coherence of the radiation. Part of the laser beam may interfere with itself, causing speckle patterns that degrade the uniformity. The degree of coherence in the laser beam varies, both with the laser type and the application. For example, in optical lithography achieving high resolution in the image requires reducing chromatic aberrations in the imaging optics, and this in turn requires reducing the wavelength bandwidth $\Delta\lambda$ of the radiation. This can be done by reducing the number of longitudinal modes at which the laser operates, as well as by employing wavelength filters. The coherence length $L_{coh}$ of the radiation source 42 emitting radiation centered at the wavelength $\lambda$ is $$L_{coh}=\lambda^2/\Delta\lambda. \qquad \text{(Eq. 4)}$$

If the differences in optical path length, from primary source to the recombination point, of different secondary beam sources exceed $L_{coh}$, then the recombining radiation will not interfere coherently, and speckle patterns will not be formed. Conversely, if the wavelength bandwidth is small, and the coherence length $L_{coh}$ is large, the radiation will be highly coherent, and prominent speckle patterns will occur.

Fan et al., U.S. Pat. No. 4,744,615 shows that if the width W of the light pipe satisfies the relation $$W > L_{coh}(R+[1+R^2]^{1/2}), \quad (Eq. 5)$$

where R is the aspect ratio of the light pipe, R=W/(Length of light pipe), the secondary beams formed in the light pipe will not interfere coherently.

The difference in optical path lengths between secondary radiation sources can be increased further by introducing retardation plates of varying thickness into each secondary radiation source optical path. The retardation plates are optically transparent plates of thickness t and index of refraction n (at the radiation wavelength), so their optical path length is nt. By choosing appropriate values of t and n, the optical path length of each secondary radiation source can be made to differ from that of any other secondary source by more than $L_{coh}$, and so coherence effects can be avoided. Such methods are described in e.g. Shibuya and Uehara, U.S. Pat. No. 4,619,508, and U.S. Pat. No. 4,744,615, respectively, the contents of which are incorporated herein by reference.

Dithering the beam, as described earlier, can also reduce the effects of speckle.

Lasers employed in material processing typically do not have demanding imaging requirements. Therefore, they are not required to have very narrow spectral widths, and consequently their coherence lengths $L_{coh}$ are usually much shorter than those found in lithography systems. Consequently, beam shaping systems for material processing applications tend to be simpler than those employed in photolithography. Because the imaging requirements for some of the embodiments of the present invention are not very demanding, when compared to those in photolithography, the lasers and beam shaping systems used in material processing should be suitable for at least some of the embodiments.

One embodiment of a beam shaper 44 that is suitable for a relatively low coherence laser application is described herein. In this embodiment, the laser beam is collected by a bundle of optical fibers which are intermingled in a random or predetermined format to produce an approximately uniform intensity profile. The fibers at the distal end are fused to allow further mixing of light from the various fibers and eliminate dark regions associated with the cladding layers of the individual fibers. This device is described in U.S. Pat. No. 4,932,747, the contents of which are incorporated herein by reference. For example, for a KrF excimer laser with $\lambda$=248 nm and $\Delta\lambda \approx 0.3$ nm, Eq. 4 gives $L_{coh} \approx 0.2$ mm. If the optical path lengths of the optical fibers, or the distance traveled by laser light to a given fiber, or the combination, vary by this much, coherence effects in the transmitted radiation can be ignored.

Another approach to making a laser beam uniform for material processing is described by T. Sameshima and S. Usui in Optics Communications 88, 59(1992), the contents of which are incorporated herein by reference. In this approach, a laser beam is split into two beams at a partially reflecting mirror. The transmitted beam is divided into left and right halves, which are exchanged to opposite sides of the beam axis and then collimated by a pair of prisms. Two turning mirrors then serve to recombine the altered beam with the original beam at the partially reflecting mirror. By adjusting the mirror reflectivity to 33%, the combined output beam is made approximately uniform and collimated. Additional stages of similar processing steps could improve the uniformity further.

In addition to a single laser radiation source 42, a semiconductor laser diode bar may be used. Such bars are monolithic linear arrays of semiconductor diode lasers producing parallel beams of laser light. They typically emit radiation in the near infra red part of the spectrum. One example of an array is a bar 1 cm long containing 19 semiconductor lasers spaced 0.5 mm apart. Optical powers exceeding 50 W are available. A suitable diode array can be purchased from Coherent Inc., located in Santa Clara, Calif. The laser beams are divergent but can be collimated by an array of lenslets followed by a cylindrical lens, as described in U.S. Pat. No. 5,541,951, the contents of which are incorporated herein by reference. The collimated beams can then be focused into an optical fiber bundle and the fibers rearranged to produce an output beam of a given shape. For example, the fibers at the output end of the bundle could be arranged in a square or rectangular shape, or they could be arranged in a circular shape. The beams are somewhat similar to the secondary beams described above and may be combined as described earlier to produce a beam of uniform intensity. Alternatively, the fibers could be fused together near the distal end to produce a single beam of approximately uniform intensity and of a shape determined by the fused end of the fiber bundle.

In some embodiments, as described earlier, the illumination power required to heat the cathode 38 may exceed 10 to 20 W, in order to compensate for radiative power losses. This power level is far from the threshold power region where the lasers are just beginning to lase, and where laser output is changing very rapidly with control current. Far from the threshold region, the laser output is linearly proportional to the control current delivered to the laser array, so control of the output laser power can be precise and straightforward.

The radiation wavelength bandwidth of the laser diode bars is typically $\Delta\lambda \approx 3-5$ nm. At a radiation wavelength of $\lambda$=800 nm the related coherence length is $L_{coh}$=0.13–0.21 mm, so coherence effects can be expected to be negligible with this radiation source.

Alternatively, the laser diodes can emit into the aperture of a nearby multimode light transmitting fiber. The proximate end is elliptical or polygonal in shape with the long axis lying in the plane of the laser emitters and long enough to admit essentially all of the laser radiation. The fiber is distorted in form along its length so that the distal end is shaped appropriately for the given application. An example is described in U.S. Pat. No. 4,688,884, the contents of which are incorporated herein by reference. For example, the distal end might have a square or rectangular shape, or it might have a circular shape.

Having obtained an approximately uniform intensity distribution at the source beam 46, the radiation intensity of the shaped beam 48 may be adjusted to give the desired intensity distribution at the illuminated side 52 of the cathode 38.

The dependence of the electron beam 32 properties on the shaped beam 48 size and intensity can be demonstrated using the Richardson-Dushman equation, Eq. 1. The shaped beam 48 heats the illuminated surface 52 of the cathode 38. Part of the heat radiates away as black body radiation, and the rest diffuses through the cathode 38 to the electron emitting surface 50, where a fraction of the remaining heat radiates away as well. Additionally, some fraction of the heat diffuses laterally into the un-illuminated regions of the cathode 38 and through the mechanical structures holding the cathode 38 to other parts of the electron gun 30 structure. The effect of the diffusion of the heat is to alter the temperature distribution of the electron emitting surface 50 from that at the illuminated surface 52. In general, the temperature distribution at the electron emitting surface 50 will be more spread out and less sharply defined because of the diffusion. As a result thereof, a shaped beam 48 intensity which produces a uniform temperature distribution on the illuminated surface 52 can generate a temperature distribution on the electron emitting surface 50 which varies somewhat with position. Because the electron current density depends exponentially on the temperature, as well as quadratically, the electron beam 32 current density will not be uniform. This is illustrated graphically in FIG. 2A, which shows an intensity profile 200A for the shaped beam 48, the temperature distribution 202A of the emitting surface of the cathode, and the electron emission current density 204A. The illumination intensity profile 200A of the shaped beam 48 is flat topped. However, because of thermal diffusion effects, the resulting temperature distribution 202A of the electron emitting surface 50 is more rounded at the edges, leading to further rounding of the electron current density 204A distribution, as predicted by Eq. 1. The cathode 38 material work function was assumed to be 4 eV, and the cathode 38 temperature was set to 2000° K. The size of the electron beam 32 whose current density is uniform to within 1% is about 1.3 mm. Note that the size of the illuminated region of the cathode 38 is significantly larger.

The electron beam 32 uniformity can be improved by several means. If the size of the shaped beam 48 of uniform intensity is increased, the size of the electron beam 32, which is uniform to within 1%, will increase as well. However, this will require more power delivery in the shaped beam 48 and more power dissipation in the cathode 32, which may not be desirable.

Figure 2B:
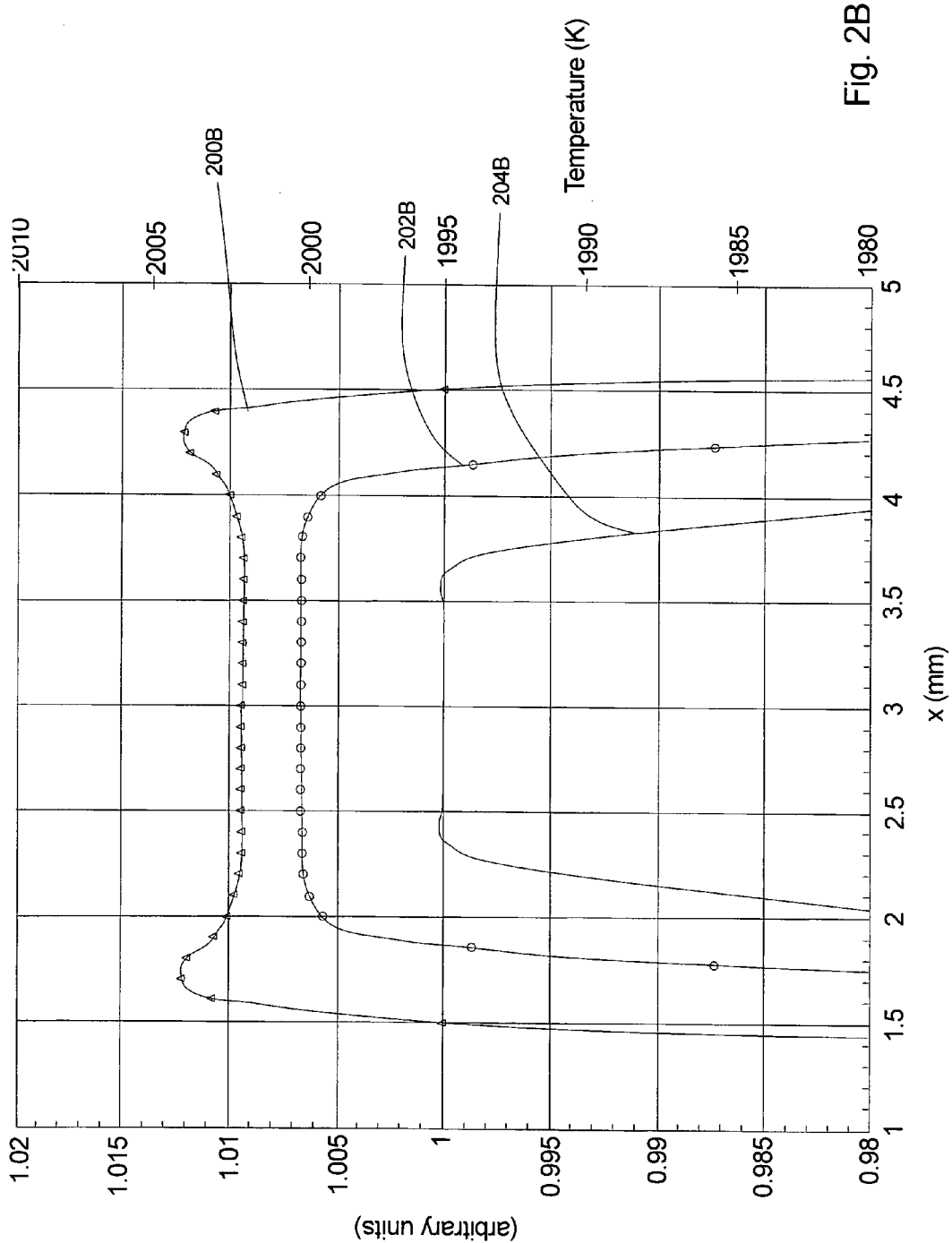

FIG. 2B graphically illustrates an alternative intensity profile 200B for the shaped beam 48, the temperature distribution 202B of the emitting surface of the cathode, and the electron emission current density 204B. As shown in FIG. 2B, the intensity distribution profile 200B of the shaped beam 48 can be adjusted, so that the lateral diffusion of heat within the cathode 38 is partially compensated by increasing the shaped beam 48 intensity near its periphery. The additional heat supplied near the periphery of the shaped beam 48 helps to maintain a constant temperature profile 202B at the electron emitting surface 50, thereby increasing the region within which the electron beam 32 intensity remains approximately uniform. The size of the uniform (to within 1%) electron beam 32 in this example is now approximately 1.8 mm. The two means described here could be used together for further improvement in uniform electron beam 32 size. The optimal size and distribution of the shaped beam 48 intensity 200B must be determined either by models, which solve the heat equation for the appropriate conditions, or empirically, by adjusting the shaped beam 48 properties and measuring the resulting electron beam 32 properties. Since these can be controlled from outside the gun housing 40, this optimization is relatively straightforward.

Other intensity distributions of the shaped beam 48 may be required in other circumstances. For example, Eq. 1 shows that the electron beam 32 current density also depends exponentially on the work function $\phi$. While a single crystal is preferentially used for the cathode 38, local surface conditions may cause a variation of $\phi$. This may occur because of damage to the illuminated surface 52 of the cathode 38 from ion bombardment, or contamination from an imperfect vacuum. For similar reasons, the surface emittance may vary somewhat. Because this will affect the amount of black body radiation emitted, it may alter the cathode 38 temperature locally somewhat, thereby changing the electron emission. However, with the present invention, appropriate adjustments to the beam shape and intensity can in principle correct and/or reduce these effects.

If the changes in electron emission are very localized, however, complete compensation by adjustment of the cathode 38 temperature distribution may be difficult. The reason is that even a "delta function" type of intensity distribution on the illuminated surface 52 will create a region of temperature variation of finite extent on the electron emitting surface 50 of the cathode 38, because of the thermal diffusion of the heat within the cathode 38. Therefore, correctable electron emission variations must exceed some minimum size determined by the diffusion characteristics of the cathode 38. Such minimum size can be determined empirically or by modeling.

By effectively and selectively shaping the intensity, the shape, and size of the shaped beam 48, it is possible to adjust the temperature distribution of the cathode 38 to provide the desired shape, intensity, size, uniformity and characteristics of the electron beam 32. By changing the shape, size and intensity of the shaped beam 48 that is directed on the cathode 38, it is possible to produce electron beams 32 of various shapes and dimensions from a single cathode 38 of adequate size. This is advantageous when exposing reticles 12 with different geometrical subfield shapes or sizes. With this design, no changes to the electron gun 30 would then be required to produce electron beams 32 of various dimensions.

Figure 3:
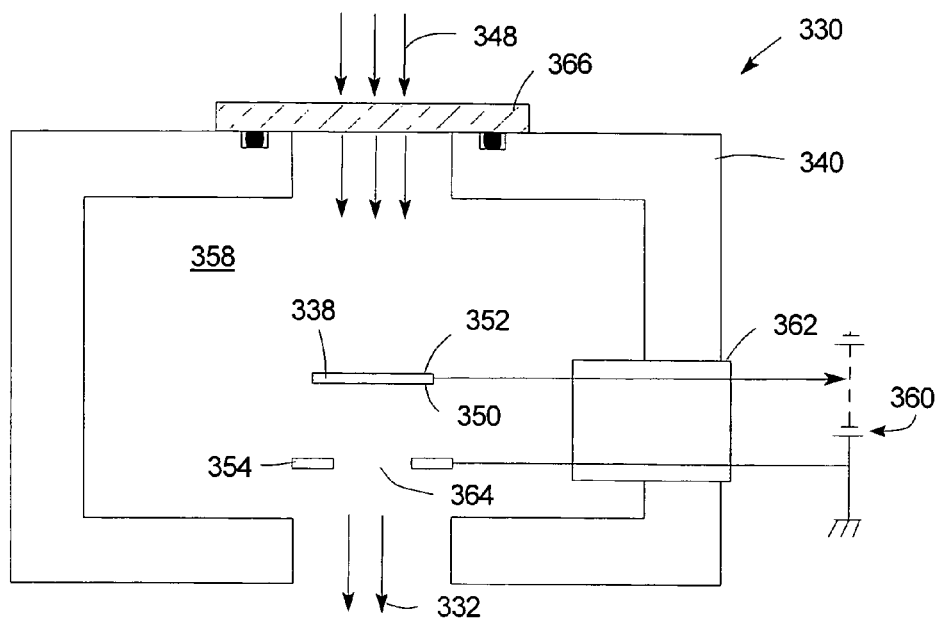
FIG. 3 is a schematic illustration of a first embodiment of an electron gun having features of the present invention.

FIG. 3 is a schematic illustration of a first embodiment of the electron gun 330, a portion of the shaped beam 348 and a portion of an electron beam 332. In this embodiment, the electron gun 330 includes a gun housing 340 and two electrodes, namely a cathode 338, and an anode 354. However, the design of the components of the electron gun 330 can be varied.

The gun housing 340 forms an outer structure that encloses the other components of the electron gun 330 and defines a housing chamber 358. The gun housing 340 provides a controlled environment, e.g. a vacuum tight enclosure, for the electron gun 330. It can be hermetically sealed to the illumination optical assembly 26 (illustrated in FIG. 1). The gun housing 340 can be made of a rigid material such as stainless steel, mild steel, or aluminum, for example. The housing chamber 358 can be maintained at a vacuum state.

The electron gun 330 can operate by thermionic emission where the cathode 338 is heated with the shaped beam 348 to a temperature high enough to cause electrons to be emitted from the cathode 338, as described by Eq. 1.

The size, shape and location of the cathode 338 can be varied. In FIG. 3, the cathode 338 is generally circular plate shaped and includes an illuminated surface 352 and an electron emitting surface 350. The shaped beam 348 is directed at the illuminated surface 352 and the electrons are emitted from the electron emitting surface 350. In FIG. 3, the illuminated surface 352 faces upward and the electron emitting surface 350 faces downward. Further, the cathode 338 is centrally located near a bottom of the housing chamber 358 of the electron gun 330. However, other orientations and positions of the cathode 338 are possible. Suitable materials for the cathode 338 include tungsten, tantalum, molybdenum, lanthanum hexaboride or other similar metals. Alternatively, the cathode 338 could have other shapes; for example it could be a rectangularly shaped plate. Additionally, the plate thickness of the cathode 338 might vary.

Electrons emitted from the heated cathode 338 are accelerated by a strong electric field between the anode 354 and the cathode 338. To establish this strong electric field, the anode 354 is connected to ground potential and the cathode 338 is connected to relatively high negative potential from a high voltage power supply 360. The electrical connections pass through a high voltage insulator 362 in the gun housing 340. This high negative potential can be approximately negative 100 kV relative to ground potential. Alternatively, for example, the cathode 338 can be connected to negative potential higher than negative 100 kV or lower than negative 100 kV.

The anode 354 is substantially planar except for a small anode aperture 364 required for the passage of electrons. As a result of this configuration, a uniform electric field is created between the cathode 338 and the anode 354 that helps to maintain uniform intensity of the electron beam 332. The anode 354 can be positioned substantially between the cathode 338 and the bottom of the gun housing 340 of the electron gun 330. Additional electrodes (not shown) may also be inserted between the cathode 338 and the anode 354, which are electrically biased. These additional electrodes may be used to improve the electron beam 332 uniformity further, if needed.

The gun housing 340 also includes a window 366 that separates the cathode 338 from outside environment and allows the shaped beam 348 to be directed to the cathode 338 from outside the housing chamber 358. The window 366 is made of a material transparent to the heat source radiation. The shaped beam 348 is directed into the housing chamber 358 of the electron gun 330 through the window 366 to heat the cathode 338.

In FIG. 3, the window 366 is positioned on the top of the gun housing 340. Further, the window 366 is located substantially directly above the cathode 338. The positioning of the window 366 in this embodiment is appropriate when the heating assembly 36 (illustrated in FIG. 1) is positioned substantially directly above the electron gun 330 or when the shaped beam 348 is directed to substantially directly above the electron gun 330.

Figure 4A:
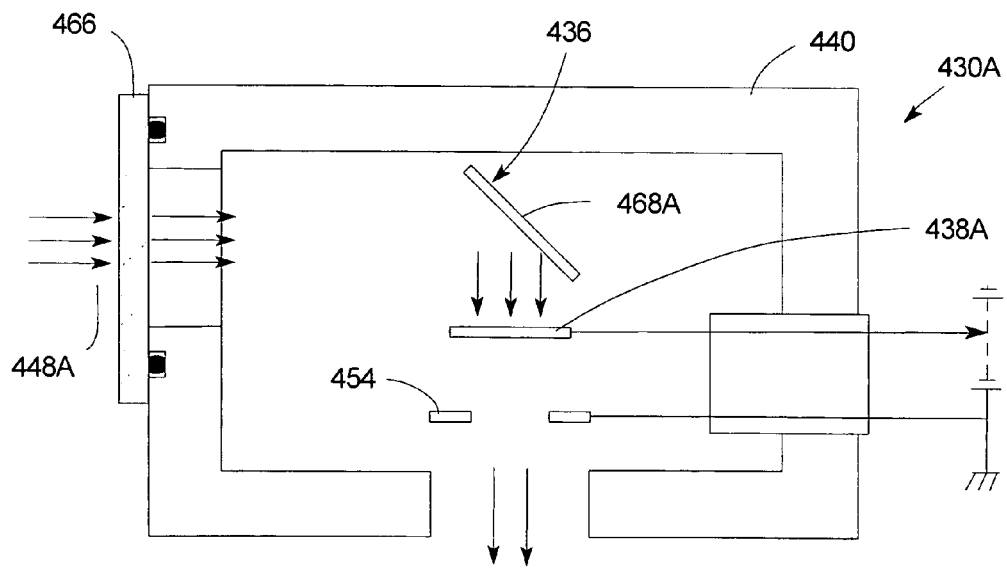
FIG. 4A is a schematic illustration of a second embodiment of an electron gun having features of the present invention.

FIG. 4A is a schematic illustration of a second embodiment of the electron gun 430A including a gun housing 440, a cathode 438A, and an anode 454 that are similar to the corresponding components described above and illustrated in FIG. 3. However, in this embodiment, the window 466 is positioned along the side of the gun housing 440. Further, the heating assembly 436 (only a portion is illustrated in FIG. 4A) includes a reflecting mechanism 468A that redirects the shaped beam 448A to the cathode 438A. The positioning of the window 466 in this embodiment is appropriate when the radiation source 42 (illustrated in FIG. 1) is positioned substantially on one of the sides of the electron gun 430A, or when the shaped beam 448A is directed to a position directly to one of the sides of the electron gun 430A. In this embodiment, the reflecting mechanism 468A is positioned within the gun housing 440, substantially directly above the cathode 438A. The reflecting mechanism 468A is oriented at an angle so that the shaped beam 448A will strike the reflecting mechanism 468A and will be directed downward to the cathode 438A. The reflecting mechanism 468A, for example, can be a mirror.

Figure 4B:
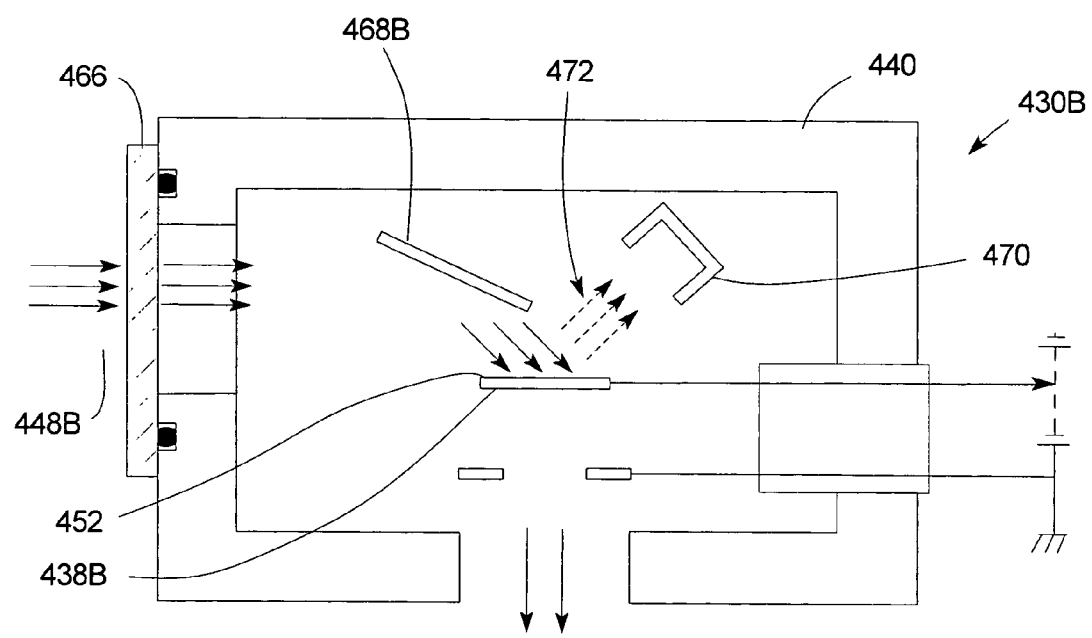
FIG. 4B is a schematic illustration of a third embodiment of an electron gun having features of the present invention.

While FIGS. 3 and 4A show the shaped beam 348, 448A striking the cathode 338, 438A at approximately normal incidence, FIG. 4B schematically illustrates a third embodiment of an electron gun 430B where the shaped beam 448B is incident to the cathode 438B at an oblique angle. In that case, radiation specularly reflected from the illuminated surface 452 of the cathode 438B can be prevented from re-entering the beam shaper 44 (illustrated in FIG. 1) and instead be directed to a beam stop 470. The beam stop 470 can be designed to minimize heating of the gun assembly 28 (illustrated in FIG. 1) by reflected radiation 472. Radiation reflected back into the beam shaper 44 can scatter and provide a diffuse background of radiation which may degrade the quality of the shaped beam 448B. Furthermore, if the radiation source 42 (illustrated in FIG. 1) is a laser, it may become unstable if part of the emitted radiation is reflected back into the lasing cavity. In FIG. 4B, the shaped beam 448B is reflected from a reflecting mechanism 468B onto the illuminated surface 452 of the cathode 438B at an oblique angle. The reflected radiation 472 is collected by the beam stop 470 which may be actively cooled, so that the gun housing 440 is not heated.

One potentially undesirable feature of this embodiment is that the reflectivity from a surface typically increases when the angle of incidence changes from normal to oblique incidence. Thus, more of the radiation may be reflected from the cathode 438B and for a given amount of cathode 438B heating, the radiation source 42 must supply more power. In an alternative embodiment (not shown), the reflected radiation 472 exits the gun housing 440 through a window (not shown) and is collected by a beam stop located outside the gun housing 440.

The beam shaper 44 is not shown in FIGS. 3 and 4A and 4B. In FIG. 3, part or all of the beam shaper 44 may be located substantially above the window 366. In FIGS. 4A and 4B, part or all of the beam shaper 48 may be located to the side of the gun housing 440 and in proximity to the window 466.

Figures 5A, 5B:
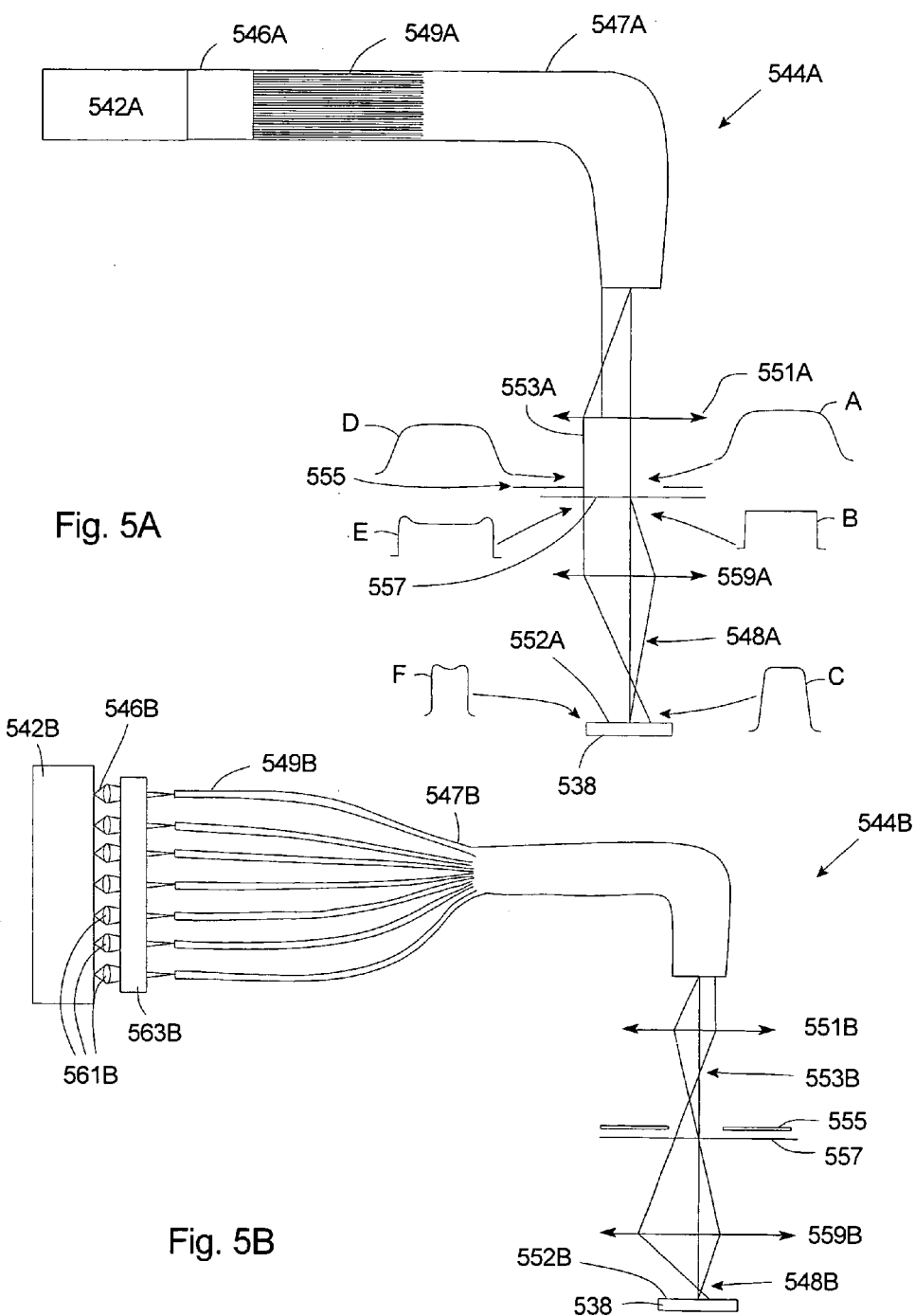
FIG. 5A is a schematic illustration of a first embodiment of a radiation source and beam shaper having features of the present invention.
FIG. 5B is a schematic illustration of a second embodiment of a radiation source and beam shaper having features of the present invention.

FIG. 5A is a schematic illustration of a first embodiment of a radiation source 542A, a beam shaper 544A, and a shaped beam 548A having features of the present invention. The radiation source 542A can be a laser, for example, of relatively low coherence, such as an excimer laser, or another type of laser operated with many longitudinal modes lasing. In this embodiment, the source beam 546A enters a beam line 547A that that transfers the source beam 546A. In one embodiment, the beam line 547 is a fiber optical bundle that includes optical fibers 549A that are intermingled in a random or predetermined format to produce the desired profile, such as an approximately uniform intensity profile at a distal end. The optical fibers 549A at the distal end are fused to allow further mixing of light from the various optical fibers 549A and eliminate dark regions associated with the cladding layers of the individual optical fibers 549A. The output radiation from the fiber bundle 547A is collimated by a condenser lens 551A into a collimated beam 553A. A field stop 555 limits the lateral extent of the illumination. The collimated beam 553A then passes through a gray level mask 557 which is imaged by a projection lens 559A onto the illuminated surface 552A of the cathode 538. The mask 557 serves to adjust the radiation intensity at the cathode 538 to the desired distribution. Although the condenser lens 551A and the projection lens 559A are represented as single lenses, they may in fact be compound lenses containing several optical components.

Radiation intensity distributions A–F are illustrated in FIG. 5A at several locations along the beam path as examples. For example, a nearly uniform intensity distribution A is produced just before the mask 557. If the uniformity and beam size is adequate and is desired, no mask 557 is needed, and the same intensity distribution is projected onto the cathode 538. If the distribution A is not uniform enough or does not have the desired profile, the mask 557 attenuates the more intense regions of the beam so that its intensity is more uniform, as shown at B. The edges of the collimated beam 553A are also clipped by the field stop 555, which determines the shaped beam 548A size at the cathode 538. In this embodiment, the shaped beam 548A distribution at the illuminated surface 552A of the cathode 538, now with the desired intensity profile and limited in size, is shown at C. The mask 557 transmission properties may be determined empirically, after measuring the radiation distribution in the plane of the field stop 555 or an equivalent plane.

In the second example, a nearly uniform radiation distribution D is apertured by the field stop 555 and adjusted by the mask 557 to produce a distribution E where the beam intensity is essentially uniform within the inner regions of the beam, but the intensity rises near the beam periphery. The distribution at the cathode surface 552A is shown in F. The mask 557 transmission properties can be determined partly empirically and partly theoretically, with the help of modeling of the cathode 538 thermal properties using solutions to the heat equation. The mask 557 can be used to create other intensity distributions as well.

FIG. 5B is a schematic illustration of a second embodiment of a radiation source 542B, a beam shaper 544B, and a shaped beam 548B having features of the present invention. In this embodiment, the radiation source 542B is a semiconductor laser diode bar which contains a linear array of semiconductor lasers. The source beam 546B, or output radiation, of each laser is focused into the end of an optical fiber 549B by individual lenslets 561B and a cylindrical lens 563B. The optical fibers 549B are combined into a fiber bundle 547B, and the optical fibers 549B may be fused together near a distal end to produce a single beam of approximately uniform intensity and of a shape determined by the fused end of the fiber bundle 547B. The output radiation from the fiber bundle 547B is collected by a condenser lens 551B forming a beam 553B. A field stop 555 limits the lateral extent of the illumination. The beam 553B then passes through the gray level mask 557 which is imaged by a projection lens 559B onto the illuminated surface 552B of the cathode 538. The mask 557 serves to adjust the radiation intensity at the cathode 538 to the desired distribution.

Two different types of optical systems are illustrated in FIGS. 5A and 5B. In FIG. 5A, the end of the optical fiber 549A is in the back focal plane of the condenser lens 551A. Consequently, each point on the illuminated part of the mask 557 receives radiation from all parts of the distal end of the fiber bundle 547A. The result is a uniform intensity at the mask 557, even if the intensity distribution at the distal end of the fiber bundle 547A deviates from uniformity. This is referred to as Koehler illumination.

In FIG. 5B, radiation at the distal end of the fiber bundle 547B is focused into the plane of the mask 557. Such illumination is sometimes referred to as critical illumination. Therefore, the radiation intensity distribution at the mask 557 will be similar to that at the distal end of the fiber bundle 547B. This is advantageous if the desired intensity distribution is produced at the distal end of the fiber bundle 547B. If the intensity distribution at the distal end of the fiber bundle 547B differs by a small amount from the desired intensity distribution, critical illumination may still be appropriate, with final corrections to the distribution made by the mask 557.

While Koehler and critical illumination schemes have been described explicitly, other illumination geometries may be appropriate as well.

Figure 5C:
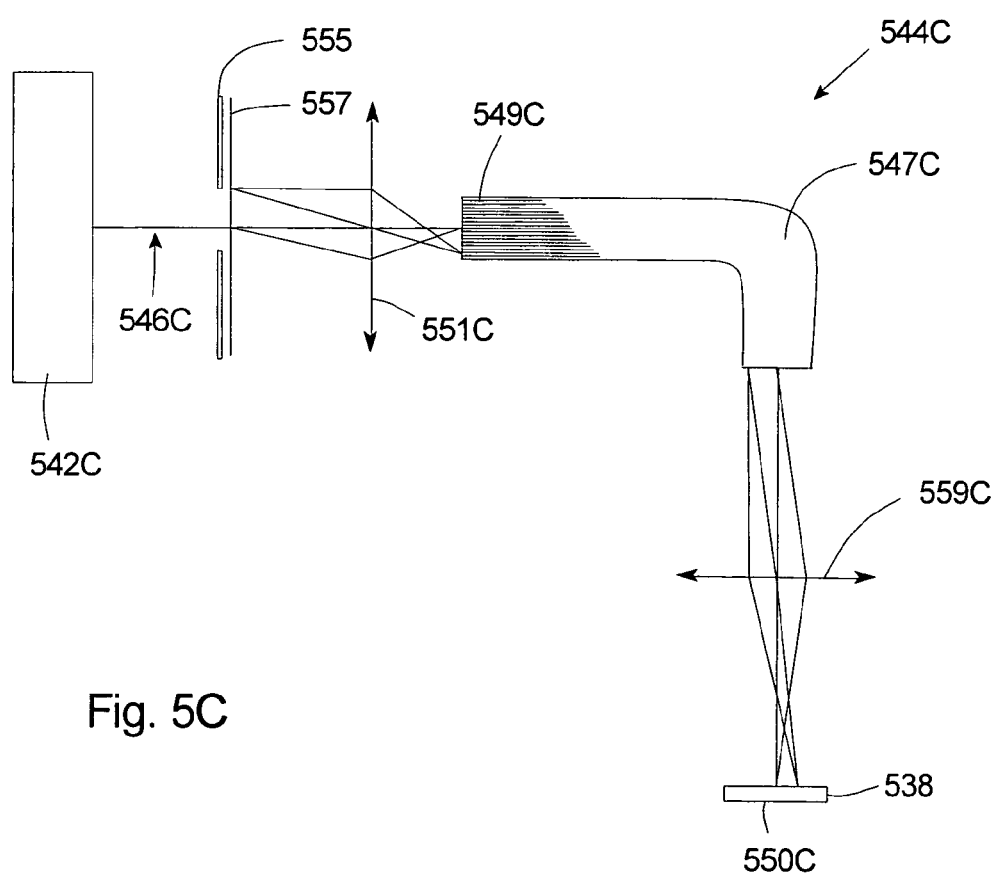
FIG. 5C is a schematic illustration of another embodiment of a radiation source and part of a beam shaper having features of the present invention.

FIG. 5C is a schematic illustration of another embodiment of a radiation source 542C and part of a beam shaper 544C having features of the present invention. In this embodiment, the source beam 546C is limited by the field stop 555 and shaped by the mask 557, and then is focused by a condenser lens 551C into an optical fiber bundle 547C. The fiber bundle 547C is made up of individual optical fibers 549C that are aligned parallel to one another, so that an optical pattern imaged on its proximal end is preserved at its distal end. The image at the distal end of the fiber bundle 547C is then imaged onto the cathode 538 by a projection lens 559C. This reduces the number of optical components which are next to the gun assembly 28 (illustrated in FIG. 1), which is sometimes advantageous. Moreover, it provides additional flexibility in locating the radiation source 542C and the beam shaper 544C.

The image at the distal end of the fiber bundle 547C and at the cathode 538 will differ from that at the proximal end, aside from magnification effects, because some of the radiation present at the proximal end will be stopped by the cladding surrounding each optical fiber 549C. Also, if the optical fibers 549C of the fiber bundle 547C are round, they will not pack together perfectly, and small spaces will remain between nearest neighbors. Thus, the image at the cathode 538 will consist of a large number of bright spots separated by narrow dark areas. If a large number of the optical fibers 549C are used to transmit the image, the bright spots will be very close together, and because of thermal diffusion in the cathode 538, the temperature distribution at the electron emitting surface 550C of the cathode 538 will not differ significantly from that created by a continuous image with the same intensity.

In the embodiments shown in FIGS. 5A–5C, the mask 557 is exposed to the full intensity of the radiation. Therefore, the mask 557 structure must be capable of tolerating the relatively high power in the radiation beam. Also, any transmission losses in the mask 557 will reduce the beam power available for heating. Additionally, it would be desirable to be able to alter and/or adjust the mask 557 pattern easily, in case the mask 557 pattern doesn't exactly match the desired illumination intensity requirements, or if the electron emitting characteristics of the cathode 538 change over time. Stated another way, by changing the pattern of the mask 557, the intensity profile of the shaped beam 546C can be changed. A number of embodiments are described which avoid these considerations and offer additional features.

Figure 6A:
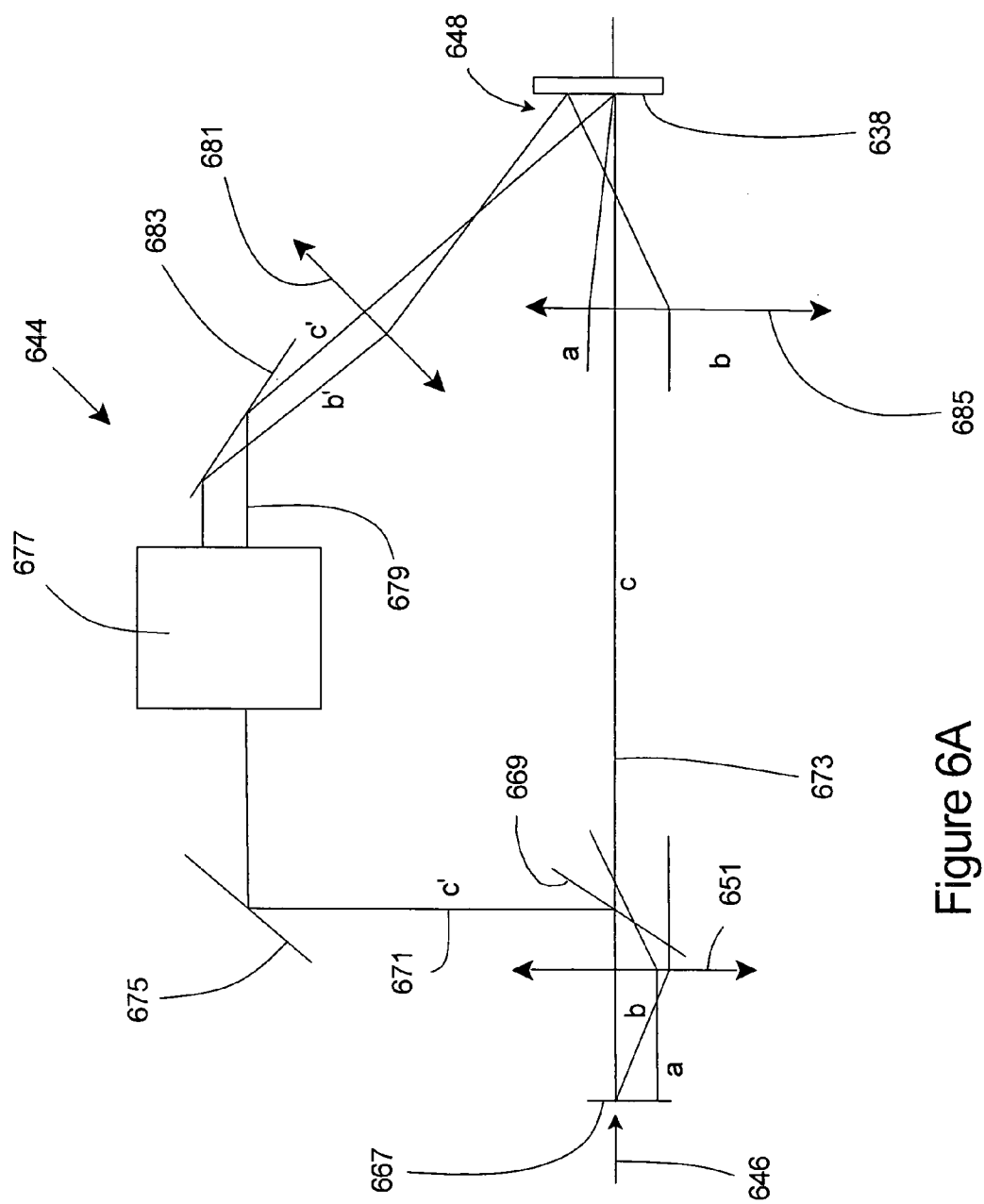
FIG. 6A is a schematic illustration of yet another embodiment of part of a beam shaper having features of the present invention.

FIG. 6A is a schematic illustration of yet another embodiment of part of the beam shaper 644 having features of the present invention. In this embodiment, a source beam 646 is of approximately uniform intensity at a plane 667, prior to being directed to a partially reflecting beam splitter 669 by a condenser lens 651. When the radiation beam 646 is directed to the partially reflecting beam splitter 669, the radiation beam 646 becomes split into a reflected beam 671, which is reflected by the partially reflecting beam splitter 669, and an undeflected beam 673, which passes through the partially reflecting beam splitter 669. The reflected beam 671 is directed to a first reflecting surface 675, which diverts the reflected beam 671 into a mask structure 677 that alters the reflected beam 671 intensity appropriately into a modified beam 679. The modified beam 679 is steered into a first projection lens 681 by a second reflecting surface 683, and then focused onto the cathode 638 in superposition with the undeflected beam 673 which is imaged by a second projection lens 685. The undeflected beam 673 and the modified beam 679 combine to define the shaped beam 648.

Additional transfer lenses (not shown) can be used to create the appropriate imaging conditions for the beams at the mask structure 677 and the projection lenses 681, 685. The letters a, b, b', c, and c' identify geometrical optical rays at several places in the diagram. The use of two projection lenses 681, 685 allow recombination of the modified beam 679 and the undeflected beam 673 without the use of a partially reflecting beam splitter which would reduce the total beam intensity. Additionally, using the two projection lenses 681, 685 also allow greater flexibility in aligning and adjusting the size of the two beams 673, 679.

In FIG. 6A, the modified beam 679 is incident obliquely on the cathode 638. While FIG. 6A is intended to be a schematic, if the angle of incidence of the modified beam 679 on the cathode 638 is too far from normal, corrections to the mask pattern contained in the mask structure 677 may be required to compensate. Alternatively, an additional optical element could be used to alter the magnification of the image of the mask pattern at the cathode 638 in the plane of incidence.

The advantage of this approach can be seen by the following example. Suppose the mask structure 677 attenuates the beam intensity uniformly by 5%, aside from the losses deliberately created by the patterning on the mask. In the embodiments shown in FIGS. 5A–5C, the beam intensity would be reduced to 95% of the original intensity by the mask structure 677. Assume that the reflected beam 671 is 10% of the radiation beam 644; then the modified beam 679 is attenuated by the mask structure 677 to an intensity of 0.95×10%=9.5% of the radiation beam 644, and the intensity of the modified beam 679 becomes 90%+9.5%=99.5%, a considerable improvement. Neglected in this example are reflection losses at the reflecting surfaces 675 and 683 and transmission losses at the additional lenses, which can be made quite small, if appropriate optical coatings on the components are used. Such coatings are well known in the art. Because these optical elements are only exposed to a fraction of the beam power, they do not have to be designed to handle high levels of power. Transmission losses in the beam splitter 669 are also ignored in this example, but they would be expected to be small.

The mask structure 677 can include a mask 557 and/or a field stop 555, as described in FIGS. 5A–5C. However, the mask structure 677 can also consist of a programmable patterning device which could allow a masking pattern to be altered by a control signal from the control system 22 (illustrated in FIG. 1). This would allow the electron beam 32 (illustrated in FIG. 1) uniformity to be adjusted in real time. A programmable patterning device may be a liquid crystal spatial light modulator. This consists of a twisted nematic liquid crystal material sandwiched between two electrically conducting plates, transparent to the radiation wavelength, and one of which is patterned into independently electrically addressable electrodes. Each addressable electrode represents one pixel of the spatial light modulator. This sandwich lies between two polarizer plates whose polarizing axes are at right angles to one another. In the absence of an electric field across the liquid crystal, polarized light passing through the liquid crystal has its plane of polarization rotated by 90 degrees, so that it is transmitted unattenuated through the second polarizer plate. If a voltage is applied to one of the addressable electrodes, the resulting electric field across the liquid crystal alters the orientation of the anisotropic liquid crystal molecules. This, in turn, alters the polarization plane of the light passing through the corresponding pixel region, thereby causing an attenuation of the light at the second polarizer. The degree of attenuation is related to the magnitude of the electric field. By supplying similar electrical signals to the other pixel electrodes, an image of variable intensity is created.

This spatial light modulator, as well as the ones discussed below, is described in the article "From cathode rays to digital micromirrors: a history of electronic projection display technology" by Larry Hornbeck in the TI Technical Journal, July–September 1998, pp. 7–46, the contents of which are incorporated herein by reference.

Spatial light modulators can operate in reflection as well as transmission mode. If one of the electrodes is made reflective, polarized light enters the liquid crystal, its plane of polarization is rotated appropriately by electric fields created at individual pixels, and the light exits in a direction opposite to its entrance direction. A polarizing beam splitter is used to create the initial polarized beam and to modulate the intensity of the reflected light. No polarizer plates are required.

Some of the beam shaper embodiments described in this application provide a shaped beam 48 (illustrated in FIG. 1) which is unpolarized. The spatial light modulators described above are not preferred in that case, because their use of polarization changes to modulate the beam intensity of individual pixels thereby rejects one polarization component of the beam, leading to a minimum transmission loss of 50% for incident unpolarized light. One solution to this problem is to employ two identical spatial light modulators, along with their related optics, and a polarizing beam splitter which separates the incident unpolarized light into its two polarization components. The two polarization components are then directed into the two spatial light modulator systems, which are adjusted to accept the appropriate polarization component. The two resulting modulated beams may be recombined by a second polarizing beam splitter. However, this adds to the cost and complexity of the system.

Figure 6B:
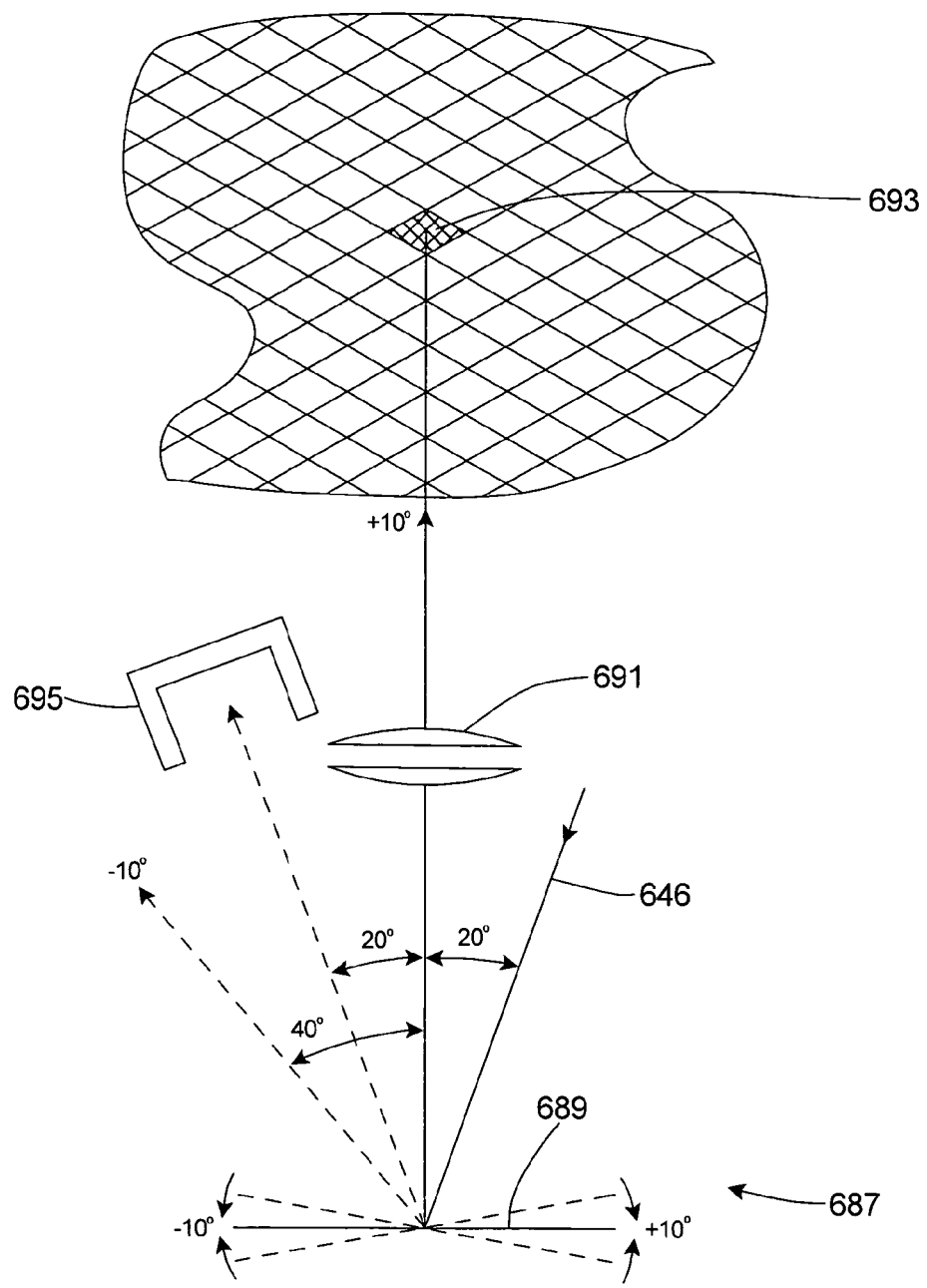
FIG. 6B is a schematic illustration showing the principles of operation of a digital micromirror device.

FIG. 6B is a schematic illustration showing the principles of operation of a digital micromirror device 687, such as a digital micromirror sold under the trademark DMD™ by Texas Instruments, located in Dallas, Tex. This type of digital micromirror device 687 is a spatial light modulator for incident unpolarized light and consists of an array of very small mirrors 689 (only one is illustrated in FIG. 6B), each representing a pixel, whose orientation can be switched between two positions by electrical signals from the control system 22 (illustrated in FIG. 1). In one orientation, a portion of the beam 646 is reflected from one of the mirrors 689 and enters the pupil of a projection lens 691, thereby providing a transmitted pixel 693; in the other orientation, the light misses the pupil and is directed to a stop 695. By switching a given mirror 689 periodically between the two states, the average amount of light transmitted to the transmitted pixel 693 can be varied, thereby allowing gray level control of the pixel intensity. The light transmitted to the other pixels can be controlled in a somewhat similar fashion.

The resolution of the image at the cathode is ultimately limited by the number of pixels in the digital micromirror device 687. However, it may be further limited by the finite resolution of the projection lens 691 or by the thermal diffusion properties of the cathode, so that the smallest resolvable area of change in the temperature distribution on the electron beam side of the cathode may include contributions from a finite number of adjacent mirrors 689. In that case, the temperature of that local area of the cathode can also be adjusted by altering the number of the corresponding mirrors 689 which reflect light into the pupil of the projection lens 691.

Figure 7A:
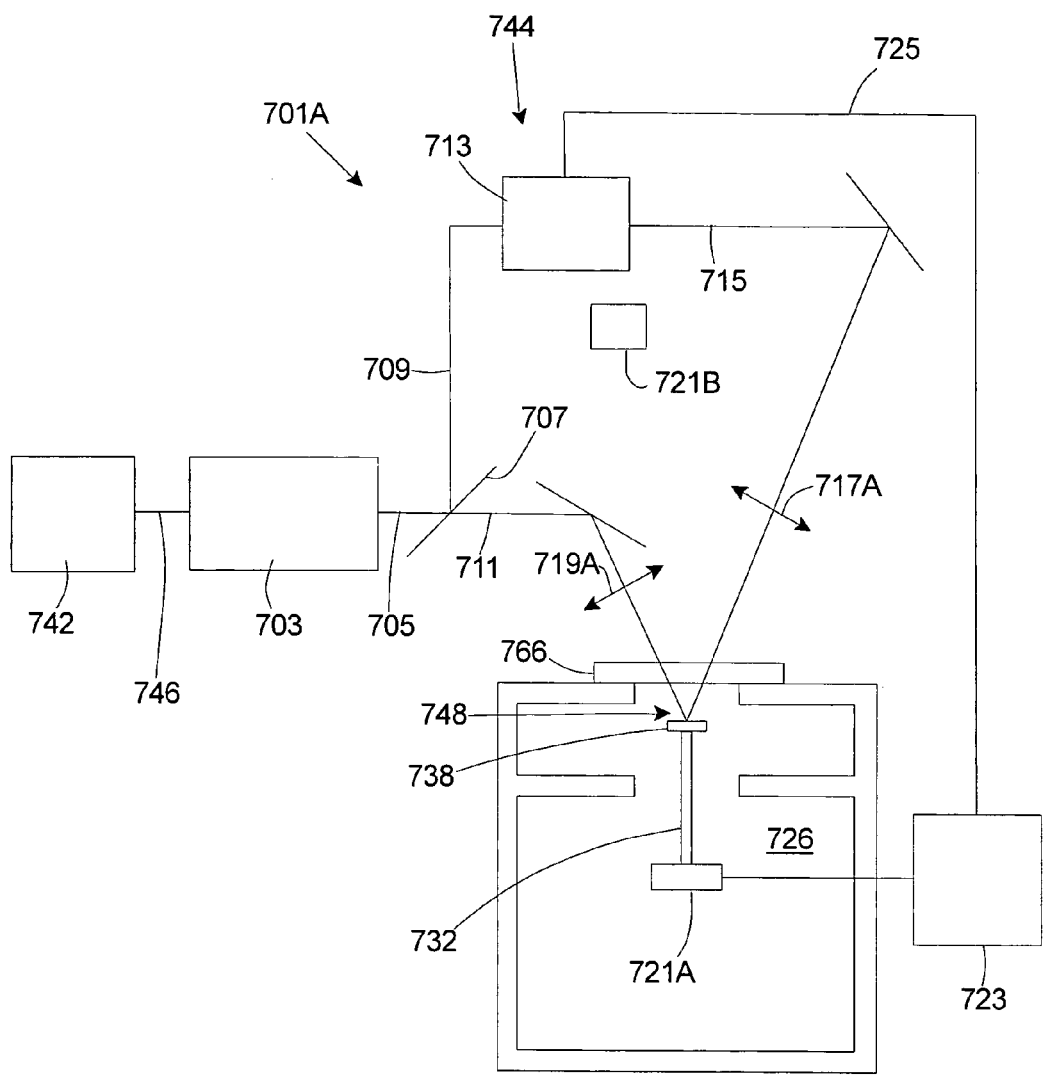
FIG. 7A is a schematic illustration of an embodiment of a beam control system for controlling the electron beam intensity distribution in real time.

FIG. 7A is a schematic illustration of an embodiment of a beam control system 701A including a beam shaper 744 which permits real time control of the shape and/or uniformity of the electron beam 732 utilizing the present invention. In this embodiment, a source beam 746 from the radiation source 742 is processed by an optical system 703 to make the radiation intensity as desired, e.g. approximately uniform. An output radiation 705 from the optical system 703 is divided by a partially reflecting mirror 707 into a reflected portion 709 and an undeflected portion 711. The reflected portion 709 of the output radiation 705 is delivered to a spatial light modulator 713, which may be a digital micromirror device. The radiation intensity of the reflected portion 709 is modified by the spatial light modulator 713 into a modified radiation 715 and focused by a first projection lens 717A onto the cathode 738 through a window 766. There it is recombined with the undeflected portion 711 of the output radiation 705, which is focused on the cathode 738 by a second projection lens 719A to form the shaped beam 748.

In one embodiment, the electron beam 732 is intercepted at an appropriate location within the electron optics of the illumination optical assembly 726 by a beam intensity monitor 721A, which measures the electron beam 732 intensity distribution. The output signal from the beam intensity monitor 721A goes to a beam intensity controller 723, which can be part of the control system 22 (illustrated in FIG. 1). The beam intensity controller 723 determines the electron beam 732 intensity distribution. Using models based on the heat equation as well as empirical data, the beam intensity controller 723 adjusts the intensity distribution of the modified radiation 715 by providing feedback 725 to the spatial light modulator 713, which results in adjustments of the spatial light modulator 713, in order to adjust the temperature distribution and/or profile on the cathode 738. This, in turn, alters the electron emission intensity from the cathode 738 and the intensity distribution of the electron beam 732.

The beam control system 701A described in FIG. 7A could also be applied in the situation where the full beam 746 passes through the spatial light modulator 713, provided the spatial light modulator 713 can tolerate the higher power levels. Additionally, the beam control system 701A may benefit from information provided by a radiation intensity monitor 721B which constantly or periodically monitors the intensity distribution. Such a monitor could be located at a plane conjugate to the spatial light modulator 713. Illumination of the monitor 721B could be achieved using a partially reflecting mirror (not shown) which passes a small amount of radiation to the monitor 727. Alternatively, a fast acting mirror could briefly divert light from the shaped beam 748 to the monitor 721B periodically, thereby providing a snapshot of the shaped beam 748 condition. If the diversion is short compared to the thermal diffusion time in the cathode 738, the effect on the cathode 738 temperature distribution should be negligible.

Figure 7B:
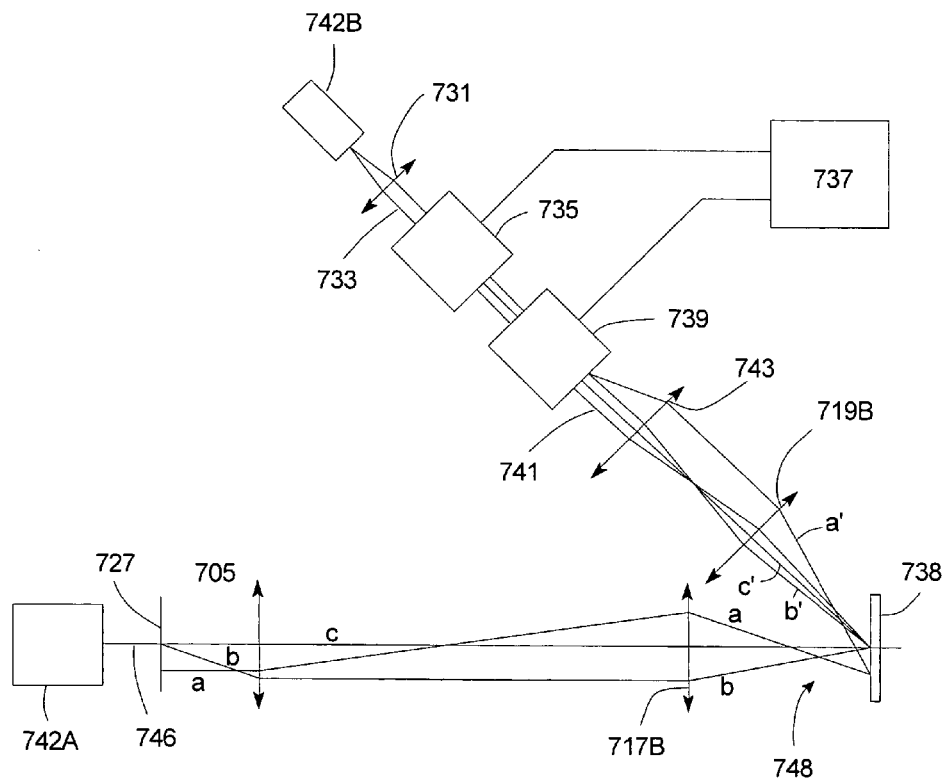
FIG. 7B is a schematic illustration of another embodiment of a beam control system for controlling the electron beam intensity distribution in real time.

FIG. 7B is a schematic illustration of another embodiment of a beam control system 701B, including a beam shaper 744 which can provide real time correction to the radiation intensity distribution at the cathode 738. An approximately uniform, shaped beam 746 is created by a radiation source 742A in a plane 727, by any of the means described earlier, and focused onto the cathode 738 by a first projection lens 717B. A separate, second radiation source 742B and a lens system 731, made up of one or more lenses, produce a small collimated beam 733. The collimated beam 733 passes through a blanker 735, which blanks (interrupts) the collimated beam 733 on command from a controller 737, which can be part of the control system 22 (illustrated in FIG. 1). The collimated beam 733 then passes through a scanner 739 which deflects the collimated beam 733, now referred to as a deflected beam 741, under command from the controller 737. A lens 743 collects the deflected beam 741, and a second projection lens 719B focuses it on the cathode 738. The geometric rays a', b', and c' in the deflected beam 741 correspond to the rays a, b, and c in the uniform shaped beam 748. Under command of the controller 737, the scanner 739 steps the deflected beam 741 over the region of the cathode 738 illuminated by the uniform shaped beam 748. At each step the blanker 735 controls the amount of radiation deposited on the cathode 738 by the deflected beam 741. Thus, a controlled and variable intensity distribution can be created at the cathode 738.

The second radiation source 742B may be a laser. It may even be a single semiconductor laser unit from a semiconductor diode laser array forming radiation source 742A, whose light has been coupled into an optical fiber and delivered to the necessary location. Earlier discussion associated with FIGS. 2A and 2B indicated that the variation in radiation intensity needed at the cathode 738 is likely to be only a few percent of the total power, because of the exponential dependence of the electron current density on cathode 738 temperature, as described by the Richardson-Dushman equation, Eq. 1. Therefore, in one embodiment, the second radiation source 742B may need to provide power only of the order of a watt or so.

The blanker 735 may be a rotating mirror which can deflect the collimated beam 733 into a beam stop (not shown) when blanking is desired by the controller 737. It may also be an acousto-optic modulator (AOM). An AOM is a crystal, transparent to the radiation whose index of refraction is periodically modulated by the presence of an ultrasonic sound wave imposed on the crystal from an attached oscillator which is controlled by the controller 737. The modulations of the index of refraction create an optical grating in the crystal which efficiently diffracts the collimated beam 733. The response time of the AOM is typically much shorter than that of a rotating mirror.

The scanner 739 deflects the collimated beam 733 in orthogonal directions, so the deflected beam 741 can cover the illuminated region of the cathode 738. This may be done with rotating mechanical mirrors, employing a galvanometer movement, or the scanner 739 may employ rotating prisms or acousto-optic modulation, or electro-optic modulation. In one embodiment, for this application, the scanner 739 will employ galvanometer mirrors.

A summary of information about modulation and scanning of optical beams may be found in the book "Elements of Modern Optical Design", by Donald O'Shea (John Wiley & Sons, 1985), the contents of which are incorporated herein by reference.

Under command of the controller 737, the scanner 739 deflects the collimated beam 733 over the illuminated region of the cathode 738 in small steps and the blanker 735 adjusts the energy deposited at each step location. If the time required to step over the entire illuminated region of the cathode 738 is short compared to the thermal diffusion time of the cathode 738, the resulting intensity distribution at the cathode 738 will be equivalent to that of a stationary intensity distribution projected onto the cathode 738, as might be provided by the embodiment shown in FIG. 7A. As mentioned earlier, periodic power variations of several percent at a typical cathode 738 do not have an appreciable effect on the electron emission, if the frequency of the modulation exceeds several Hertz. Galvanometer scanners can easily refresh a rastered deflection field at higher frequencies than that.

Figure 8A:
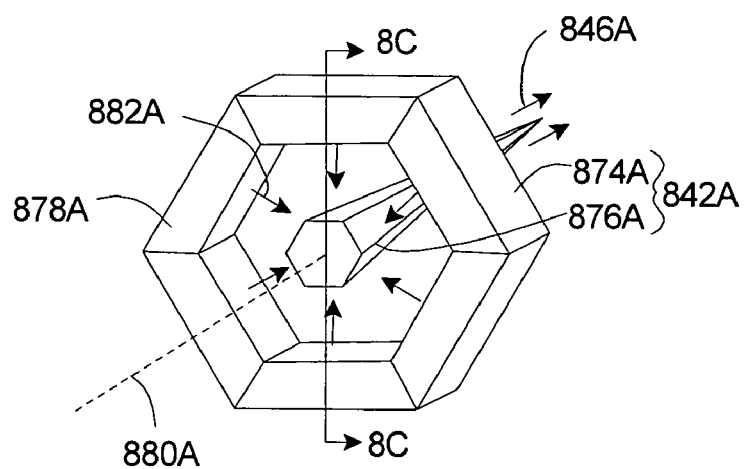
FIG. 8A is a perspective illustration of another embodiment of a radiation source.
Figure 8B:
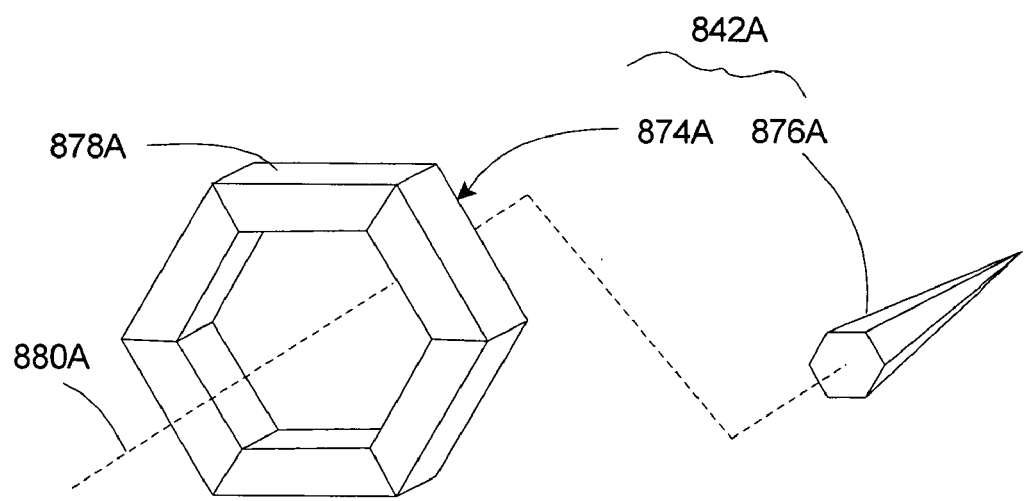
FIG. 8B is an exploded perspective illustration of the radiation source of FIG. 8A.
Figure 8C:
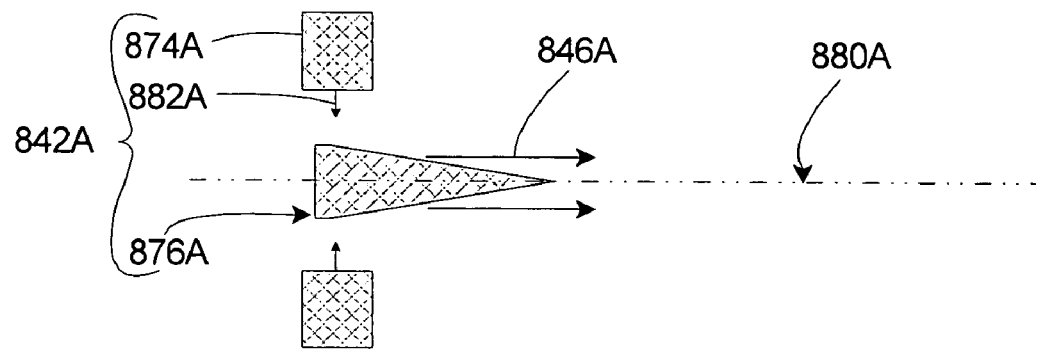
FIG. 8C is a cut-away illustration of the radiation source taken on line 8C—8C in FIG. 8A.

FIG. 8A illustrates a perspective view, FIG. 8B illustrates an exploded perspective view, and FIG. 8C illustrates a cross-sectional view of another embodiment of a radiation source 842A having features of the present invention. In this embodiment, the radiation source 842A includes an annular ("donut") shaped laser diode array 874A and a radiation source redirector 876A. The "donut" shaped laser diode array 874A includes six short laser diode bars 878A that are arranged circumferentially about a source axis 880A. Such laser diode arrays are available from Laser Diode Array, Inc. of Auburn, N.Y. However, the diode array 874A could include more than six or less than six diode bars 878A. Laser beams 882A from each of the diode bars 878A are directed radially inward toward the source axis 880A. The radiation source redirector 876A receives the laser beams 882A that are directed radially inwards and redirects the laser beams 882A into another pattern. For example, in FIGS. 8A–8C, the radiation source redirector 876A is somewhat cone shaped and is positioned and centered along the source axis 880A. In this embodiment, the laser beams 882A are redirected into a source beam 846A that is substantially transverse to the laser beams 882A and substantially parallel to the source axis 880A.

An axicon mirror (not shown) can be used as the radiation source redirector 876A. The radiation source redirector 876A apex angle can be changed to adjust the angular distribution of the light. Also the radiation source redirector 876A can be axially symmetric or it can be facetted. The facets can be planar surfaces or curved surfaces to further alter the light intensity. Each of the surfaces can be a mirror or another type of reflective material.

Figure 8D:
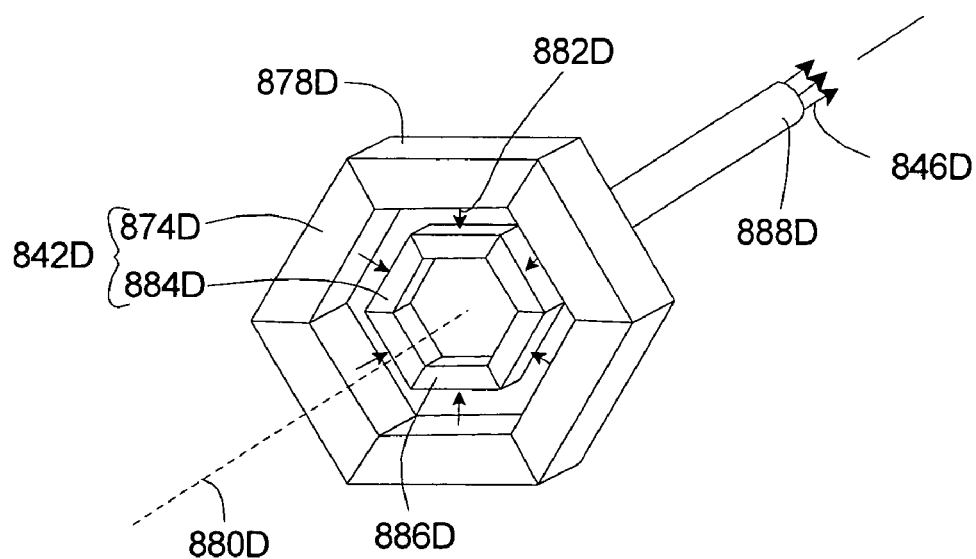
FIG. 8D is a perspective illustration of yet another embodiment of the radiation source.

FIG. 8D illustrates a perspective view of another embodiment of a radiation source 842D having features of the present invention. In this embodiment, the radiation source 842D includes an annular ("donut") shaped laser diode array 874D and a beam line 884D. The "donut" shaped laser diode array 874D includes six short laser diode bars 878D that are arranged circumferentially about a source axis 880D. Laser beams 882D from each of the diode bars 878D are directed radially inward toward the source axis 880D.

FIG. 8D also illustrates that the beam line 884D can be used to shape, or at least partly shape, and/or homogenize the laser beams 882D that form the source beam 846D. The beam line 884D can include one or more fiber optic cables (not shown). The fiber optic cables of the beam line 884D can be oriented to shape the generally radially directed laser beams 882D at the radiation source 842D to another shape, such as a shaped beam 848D having another shape, such as a circular cross-section, a rectangular cross-section, or an oval cross-section. In FIG. 8D, a first end 886D of the beam line 884D receives the plurality of laser beams 882D that are directed radially inward. Further, a second end 888D of the beam line 884D is arranged so that the shaped beam 848D exiting the beam line 884D has a different shape, such as a rectangular, circular, or oval cross-section.

Figure 9A:
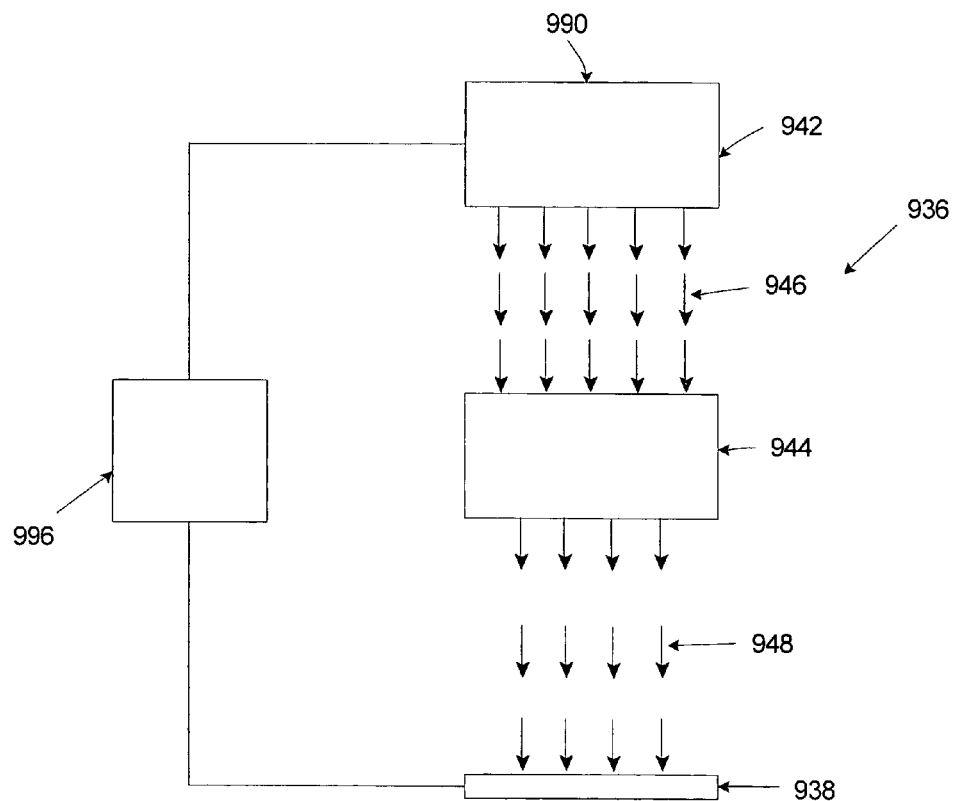
FIG. 9A is a schematic illustration of a heating assembly including yet another embodiment of a radiation source having features of the present invention.

FIG. 9A is a schematic illustration of another embodiment of a heating assembly 936 that can be used to heat a substance 938. The type of substance 938 heated by the heating assembly 936 can be varied. For example, the substance 938 can be a cathode of an electron gun. Alternatively, the heating assembly 936 can be used to transfer energy onto an energy absorber. For example, this heating assembly 936 can be sued for a photocell energy conversion application, for a biomedical tissue heating application, or for any other similar application.

In FIG. 9A, the heating assembly 936 includes a radiation source 942, a beam shaper 944, and a pulse controller 996, which can be part of the control system 22 (illustrated in FIG. 1). In this embodiment, the beam shaper 944 can have one or more elements of the beam shapers described and illustrated above. However, in FIG. 9A, the radiation source 942 is a pulsed source 990, such as a pulsed laser, that generates a pulsed source beam 946. Further, in this embodiment, the beam shaper 944 can shape the pulsed beam 946 onto a pulsed shaped beam 948. Alternatively, for example, the heating assembly 936 can be designed and used without the beam shaper 944. With this design, the source beam 946 is directed to the substance 938.

The pulsed source 990 can be used to provide precision continuous analog heating of the substance 938 when small incremental amounts of heat need to be added. The pulsed source 990 can help to overcome the difficulty of controlling semiconductor lasers near threshold, where linear transfer from the commanded power signal and the actual power output may be difficult to preserve in a linear region.

Stated another way, the pulsed source 990 can provide precision heating of the substance 938 by generating the pulsed beam 946 using controlled bursts, or pulses, at a fixed power level, which can vary in duration and frequency. In alternative embodiments, for example, the pulsed source 990 can generate the pulsed beam 946 with pulses having on time with a duration of approximately 1 microsecond to 50 milliseconds. Stated another way, the amplitude and duration of the laser are dependent on the size of the object to be heated. Generally, the bigger the object, either the longer the duration or the larger the amplitude of the laser.

With this design, the pulsed source 990 does not dissipate output as it is switched on and off, and the output of the pulsed source 990 is either fully on or fully off. In other words, the pulsed source 990 alternates between an on position and an off position, and does not require usage of a lower power percentage of the source 990, e.g. 80% of full power, that may result in heat being generated at the switch and a resultant power loss in the switch.

Relatively short bursts of the pulsed source 990 would deliver relatively low amounts of energy to the substance 938, whereas longer bursts of the pulsed source 990 would deliver higher amounts of energy to the substance 938. The duration of the bursts of the pulsed source 990 during each period is controlled by the desired amount of heat to the substance 938. The frequency of the pulses is determined by the control system 22 (illustrated in FIG. 1) to achieve the desired bandwidth, similar to that of a Pulsed Width Modulation (PWM) system. When the substance 938 becomes heated, it can have a long thermal constant which makes PWM possible. Further, the frequency of the bursts may be either fixed or variable, depending upon the requirements of the particular system. In one embodiment, the minimum frequency of the bursts is selected by the Nyquist Stability Criterion, although in practical situations the frequency is typically much greater to avoid phase lag of the control loop. For example, a 100 Hz system might use a pulsed laser with a frequency of 1 kHz. By adjusting the duration and the frequency of the bursts of the pulsed source 990, it is possible to control the pulsed source 990 in a manner completely analogous to power control of electricity in PWM techniques.

Alternatively, the pulsed source 990 can include multiple, or variable power level settings in order to make the burst durations more precise. For example, for precise transfer of small amounts of energy, the pulsed source 990 can be dynamically adjusted to a lower output level, thereby necessitating a longer burst duration, which can result in more precise results (e.g. instead of one millisecond at 1 watt, for example, 10 milliseconds at 0.1 watts could be used). Further, the use of pulsing will open a class of laser-excited cathodes in which a very short laser pulse with very high power will excite an electron pulse of high brightness but similar short duration. Such pulses can be useful in accelerators.

The pulse controller 996 can control the output of the pulsed source 990. The pulse controller 996 can actively monitor the temperature of the substance 938 and can compare the actual temperature of the substance 938 to the desired temperature of the source 938. The pulse controller 996 then uses this information to control the frequency, duration and intensity of the bursts from the pulsed laser 990. This type of control is unusual because many pulsed lasers focus on the stability of the laser itself, whereas here the purpose is to control the heating of the target substance 938.

Alternatively, instead of a pulsed laser, the pulsed source 990 can be a microwave, an ultrasound, a radio-wave, or an electron beam source.

Figure 9B:
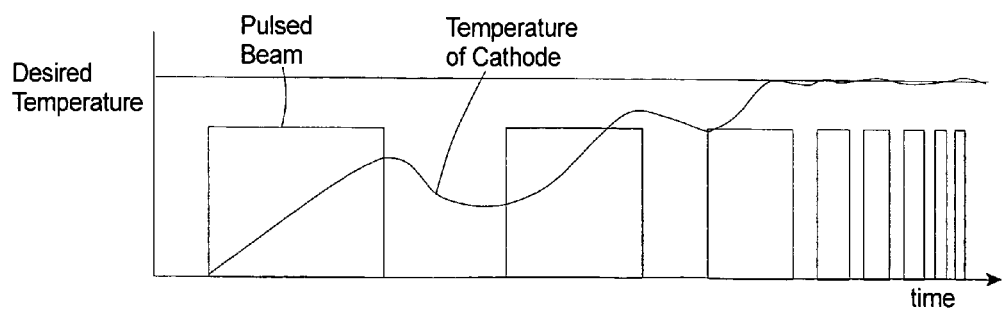
FIG. 9B is a graphic illustration of the heating of a cathode using the radiation source of FIG. 9A.

FIG. 9B is a graphic illustration of the heating of the substance 938 (illustrated in FIG. 9A) using pulses from a pulsed source 990 (illustrated in FIG. 9A). In this embodiment, the heating of the substance 938 essentially goes through two distinct phases before the substance 938 reaches the desired temperature, namely a primary phase and a secondary phase. During the primary phase, as the substance 938 initially becomes heated, the pulsed source 990 will generally use bursts of longer duration to fairly rapidly move the substance 938 temperature toward the desired temperature. As the temperature of the substance 938 starts to approach the desired temperature, the process enters the secondary phase where the duration of the bursts of the pulsed source 990 are much shorter. Finally, as the substance 938 reaches the desired temperature, the bursts of the pulsed source 990 will become very short so as to effectively and precisely maintain the substance 938 at an approximately constant desired temperature.

While the heating assembly 36 and the exposure apparatus 10 as are particularly herein shown and disclosed in detail are fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A heating assembly for heating a portion of an electron gun, the electron gun including a cathode, the heating assembly comprising:
 a radiation source that generates a source beam; and
 a beam shaper that receives the source beam and shapes the source beam into a shaped beam that is directed to the electron gun.

2. The heating assembly of claim 1 wherein the shaped beam heats the cathode.

3. The heating assembly of claim 1 wherein the shaped beam has a characteristic that corresponds to a characteristic of an electron beam generated by the electron gun.

4. The heating assembly of claim 3 wherein the shaped beam has a cross-sectional shape that is substantially the same as a cross-sectional shape of the electron beam.

5. The heating assembly of claim 4 wherein the shaped beam has a cross-sectional area that is substantially the same as a cross-sectional area of the electron beam.

6. The heating assembly of claim 1 wherein the intensity of the shaped beam is varied across a cross-section of the shaped beam.

7. The heating assembly of claim 1 wherein the intensity of the shaped beam is substantially the same across a cross-section of the shaped beam.

8. The heating assembly of claim 1 wherein the radiation source includes a plurality of laser diodes that are aligned in a substantially linear pattern.

9. The heating assembly of claim 1 wherein the radiation source includes a plurality of laser diodes that direct a plurality of laser beams substantially radially towards a source axis.

10. The heating assembly of claim 9 wherein the radiation source includes a source redirector that redirects the laser beams into a source beam that is substantially transverse to the laser beams.

11. The heating assembly of claim 1 wherein the radiation source is pulsed so that the radiation output alternates between an on position and an off position.

12. The heating assembly of claim 11 further comprising a pulse controller that controls the output of the pulsed radiation source to maintain the cathode at a desired temperature.

13. The heating assembly of claim 1 wherein the radiation source includes a pulsed laser.

14. The heating assembly of claim 1 further comprising a beam splitter that separates the source beam into a first beam portion that is directed to the electron gun and a second beam portion that is directed to the beam shaper.

15. The heating assembly of claim 1 wherein the beam shaper includes a polarizer that polarizes the source beam.

16. The heating assembly of claim 1 wherein the beam shaper includes an optical assembly that focuses at least a portion of the source beam.

17. The heating assembly of claim 1 wherein the beam shaper includes an aperture assembly that shapes at least a portion of the source beam.

18. The heating assembly of claim 1 wherein the beam shaper includes a filter assembly that modifies the intensity of the source beam.

19. The heating assembly of claim 1 wherein the beam shaper includes at least one of an optical assembly, an aperture assembly, a filter assembly, a mask structure, a mask, a field stop, a programmable patterning device, a blanker, and a scanner.

20. The heating assembly of claim 1 wherein the beam shaper includes a programmable patterning device.

21. The heating assembly of claim 1 wherein the beam shaper includes a beam line that transfers the source beam.

22. The heating assembly of claim 21 wherein the beam line alters the shape of the source beam.

23. The heating assembly of claim 1 wherein the beam shaper includes a mask structure that alters the shape of the source beam.

24. The heating assembly of claim 1 further comprising a beam stop that receives the light reflected from the cathode.

25. The heating assembly of claim 1 wherein the beam shaper includes a blanker.

26. A gun assembly including an electron gun and the heating assembly of claim 1 directing the shaped beam to the electron gun.

27. An exposure apparatus including the gun assembly of claim 26.

28. An object on which an image has been formed by the exposure apparatus of claim 27.

29. A semiconductor wafer on which an image has been formed by the exposure apparatus of claim 27.

30. A gun assembly comprising:
an electron gun including a cathode; and
a radiation source that generates a beam for heating the cathode, the radiation source including a laser diode array having a plurality of laser diodes.

31. The gun assembly of claim 30 wherein the laser diodes are arranged in a substantially linear array.

32. The gun assembly of claim 30 wherein the laser diodes direct a plurality of beams substantially radially towards a source axis.

33. The gun assembly of claim 32 wherein the radiation source includes a source redirector that redirects the beams into a source beam that is substantially transverse to the laser beams.

34. The gun assembly of claim 30 further comprising a beam shaper that receives the beam and alters the intensity of the beam.

35. The gun assembly of claim 30 further comprising a beam shaper that receives the beam and shapes the beam into a shaped beam that is directed to the electron gun.

36. The gun assembly of claim 35 wherein the shaped beam has a cross-sectional shape that is substantially the same as a cross-sectional shape of the cathode.

37. The gun assembly of claim 36 wherein the shaped beam has a cross-sectional area that is substantially the same as a cross-sectional area of the cathode.

38. The gun assembly of claim 35 wherein the beam shaper includes at least one of (i) an optical assembly that focuses at least a portion of the beam, (ii) an aperture assembly that shapes at least a portion of the beam, and (iii) a filter assembly that modifies the intensity of the source beam.

39. The gun assembly of claim 35 wherein the beam shaper includes a programmable patterning device.

40. The gun assembly of claim 35 wherein the beam shaper includes a beam line that alters the shape of the beam into the shaped beam.

41. The gun assembly of claim 35 wherein the beam shaper includes a mask structure.

42. The gun assembly of claim 35 wherein the beam shaper includes a blanker.

43. The gun assembly of claim 35 wherein the beam shaper includes a polarizer.

44. An exposure apparatus including the gun assembly of claim 30.

45. An object on which an image has been formed by the exposure apparatus of claim 44.

46. A semiconductor wafer on which an image has been formed by the exposure apparatus of claim 44.

47. A method for heating a cathode of an electron gun, the method comprising the steps of:
providing a radiation source that generates a source beam; and
shaping the source beam into a shaped beam with a beam shaper.

48. The method of claim 47 further comprising the step of heating the cathode with the shaped beam.

49. The method claim 47 wherein the intensity of the shaped beam is varied across a cross-section of the shaped beam.

50. The method of claim 47 wherein the intensity of the shaped beam is substantially the same across a cross-section of the shaped beam.

51. The method of claim 47 wherein the step of providing a radiation source includes providing a plurality of laser diodes that are aligned in a substantially linear pattern.

52. The method of claim 47 wherein the step of providing a radiation source includes providing a plurality of laser diodes that direct a plurality of laser beams substantially radially towards a source axis.

53. The method of claim 47 wherein the step of providing a radiation source includes the step of pulsing the radiation source so that the radiation output alternates between an on position and an off position.

54. The method of claim 53 further comprising the step of controlling the output of the radiation source with a pulse controller by monitoring the temperature of the cathode.

55. The method of claim 47 wherein the step of providing a radiation source includes the step of providing a pulsed laser.

56. The method of claim 47 wherein the step of shaping includes the step of providing at least one of (i) an optical assembly that focuses at least a portion of the source beam, (ii) an aperture assembly that shapes at least a portion of the source beam, and (iii) a filter assembly that modifies the intensity of the source beam.

57. The method of claim 47 wherein the step of shaping includes the step of providing a mask structure.

58. A method for producing an electron beam comprising the steps of:
providing an electron gun including a cathode; and
heating the cathode with the method of claim 47.

59. A method for making an exposure apparatus that forms an image on a wafer, the method comprising the steps of:
providing an irradiation apparatus that irradiates the wafer with radiation to form the image on the wafer; and
providing an electron beam made by the method of claim 58.

60. A method of making a wafer utilizing the exposure apparatus made by the method of claim 59.

61. A method of making an object including at least the exposure process, wherein the exposure process utilizes the exposure apparatus made by the method of claim 59.

62. A method for producing an electron beam for use with an exposure apparatus, the method comprising the steps of:
providing an electron gun including a cathode; and
generating a beam that heats the cathode with a radiation source that includes a laser diode.

63. The method of claim 62 wherein the step of generating a beam includes providing a plurality of laser diodes that are aligned in a substantially linear pattern.

64. The method of claim 62 wherein the step of generating a beam includes providing a plurality of laser diodes that direct a plurality of laser beams substantially radially towards a source axis.

65. The method of claim 64 wherein the step of generating a beam includes the step of redirecting the laser beams into a source beam that is substantially transverse to the laser beams.

66. The method of claim 62 further comprising the step of shaping the beam into a shaped beam with a beam shaper.

67. The method of claim 66 wherein the step of shaping includes the step of adjusting the shape of the shaped beam.

68. The method of claim 62 wherein the step of shaping includes the step of providing a mask structure.

69. A method for making an exposure apparatus that forms an image on a wafer, the method comprising the steps of:

providing an irradiation apparatus that irradiates the wafer with radiation to form the image on the wafer; and providing an electron beam made by the method of claim 62.

70. A method of making a wafer utilizing the exposure apparatus made by the method of claim 69.

71. A method of making an object including at least the exposure process, wherein the exposure process utilizes the exposure apparatus made by the method of claim 69.

* * * * *